US012696519B2

(12) United States Patent
Cho et al.

(10) Patent No.: US 12,696,519 B2
(45) Date of Patent: Jul. 28, 2026

(54) TRANSISTOR UNIT INCLUDING SHARED GATE STRUCTURE, AND SUB-WORD LINE DRIVER AND SEMICONDUCTOR DEVICE BASED ON THE SAME TRANSISTOR UNIT

(71) Applicant: Samsung Electronics Co., Ltd., Suwon-si (KR)

(72) Inventors: Byunghoon Cho, Yongin-si (KR); Inseok Baek, Suwon-si (KR); Hyeonok Jung, Daejeon (KR); Beomyong Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 230 days.

(21) Appl. No.: 18/431,628

(22) Filed: Feb. 2, 2024

(65) Prior Publication Data

US 2024/0178291 A1 May 30, 2024

Related U.S. Application Data

(63) Continuation of application No. 17/361,890, filed on Jun. 29, 2021, now Pat. No. 11,929,414.

(30) Foreign Application Priority Data

Nov. 16, 2020 (KR) ........................ 10-2020-0153077

(51) Int. Cl.
H10D 64/27 (2025.01)
H10D 62/17 (2025.01)
(52) U.S. Cl.
CPC ......... H10D 64/519 (2025.01); H10D 62/393 (2025.01)
(58) Field of Classification Search
CPC ............ G11C 11/4074; G11C 11/4085; G11C 11/4094; H10B 12/30; H10B 12/50; H10D 64/518; H10D 89/10
See application file for complete search history.

(56) References Cited

U.S. PATENT DOCUMENTS 6,222,789 B1 4/2001 Cha
8,648,402 B2 2/2014 Han et al.
(Continued)

FOREIGN PATENT DOCUMENTS

CN 105719684 A 6/2016
CN 111199975 A 5/2020
(Continued)

OTHER PUBLICATIONS

Office Action dated Jun. 25, 2024 for corresponding KR Patent Application No. 10-2020-0153077.

*Primary Examiner* — Fazli Erdem
(74) *Attorney, Agent, or Firm* — Muir Patent Law, PLLC

(57) ABSTRACT

A transistor with a shared gate structure includes an active area and a gate. The active area has a body extending in a first direction on a substrate, and a protrusion extending in a second direction perpendicular to the first direction from a central portion of the body in the first direction. The gate is arranged above the active area to overlap a channel area of the active area, and has an inverted pi ( $\Pi$ ) structure that, from a plan view, surrounds on three sides but does not cover a portion of the active area that includes two corner portions of the active area. The active area is divided into a first active area and a second active area by a separation area extending in the second direction and separating the body and a portion of the protrusion. The protrusion is divided into a first portion separated into two sub-portions by the separation area and a second portion, wherein the first portion is between the body and the second portion in the second direction. Opposite ends of the body in the first direction corresponding to two drain areas, the second portion of the protrusion corresponding to a common source area, and the gate constitute two transistors, wherein the two transistors share the gate.

20 Claims, 25 Drawing Sheets

(56)     References Cited

U.S. PATENT DOCUMENTS

| | | | |
|---|---|---|---|
| 9,105,506 B2 | 8/2015 | Lu et al. | |
| 9,583,152 B1 | 2/2017 | Jeong | |
| 10,490,256 B2 | 11/2019 | Jeong | |
| 2011/0032786 A1 | 2/2011 | Yang et al. | |
| 2012/0193720 A1 | 8/2012 | Han et al. | |
| 2015/0055394 A1 | 2/2015 | Iwasa et al. | |
| 2019/0189186 A1* | 6/2019 | Won | H10B 12/30 |
| 2020/0051611 A1 | 2/2020 | Jeong | |
| 2021/0098488 A1* | 4/2021 | Zhu | H10D 64/037 |
| 2025/0095714 A1* | 3/2025 | Zhao | G11C 11/4085 |

FOREIGN PATENT DOCUMENTS

| | | |
|---|---|---|
| CN | 111223862 A | 6/2020 |
| KR | 10-0861209 B1 | 9/2008 |
| KR | 10-0935581 B1 | 1/2010 |
| KR | 10-2019-0073091 A | 6/2019 |
| TW | 201301449 A | 1/2013 |

* cited by examiner

Gox P

TRANSISTOR UNIT INCLUDING SHARED GATE STRUCTURE, AND SUB-WORD LINE DRIVER AND SEMICONDUCTOR DEVICE BASED ON THE SAME TRANSISTOR UNIT

CROSS-REFERENCE TO RELATED APPLICATION

This application is a continuation application us U.S. patent application Ser. No. 17/361,890, filed Jun. 29, 2021, which is based on and claims priority under 35 U.S.C. § 119 to Korean Patent Application No. 10-2020-0153077, filed on Nov. 16, 2020, in the Korean Intellectual Property Office, the disclosure of each of which is incorporated by reference herein in its entirety.

BACKGROUND

The inventive concept relates to a semiconductor memory device, and more particularly, to a transistor unit having a shared gate structure, and a sub-word line driver and a semiconductor device based on the transistor unit.

The capacity and speed of semiconductor memory devices used in various electronic systems are rapidly increasing according to the demands of users for high performance. Semiconductor memory devices may be broadly classified into volatile memory devices and non-volatile memory devices. A representative example of a volatile memory device is a dynamic random-access memory (DRAM), and a representative example of a non-volatile memory device is a flash memory. As the capacity of the DRAM increases, the number of memory cells connected to one word line increases, and the spacing (cell pitch) between word lines decreases. When a word line voltage applied to a word line is provided to more memory cells, a speed delay may occur. In order to address the speed delay of the word line voltage, a method of dividing one word line into a plurality of sub-word lines and driving each sub-word line with a sub-word line driver (SWD) is used.

SUMMARY

Aspects of the inventive concept provide transistor units capable of separating and managing repairs of defective drains while maintaining a long channel length and preventing bursting of a gate oxide layer, and sub-word line drivers and semiconductor devices based on the transistor units.

According to some embodiments, a transistor unit with a shared gate structure includes an active area, a separation area, and a gate. The active area has a body extending in a first direction parallel to a top surface of a substrate, and a protrusion extending in a second direction perpendicular to the first direction and parallel to the top surface of the substrate, the protrusion connecting to a central portion of the body, which is central with respect to the first direction, and extending in the second direction away from the body. The separation area extends in the second direction through the body to have a first end in the protrusion and a second end in the body and opposite the first end in the second direction. The separation area separates the body into two portions and separates a first portion of the protrusion into two parts, one part on each side of the separation area. The gate is arranged above the active area in a third direction perpendicular to the first and second directions, to cover a channel area of the active area, and has a structure that exposes a top of the active area with respect to the gate, at a channel-avoidance region of the active area adjacent to the second end of the separation area. The active area is divided into a first active area and a second active area by the separation area, wherein the first active area is connected to the second active area through a second portion of the protrusion. Opposite ends, in the first direction, of the body correspond to two drain areas, the second portion corresponds to a common source area, and the two drain areas, the common source area, and the gate constitute two transistors, wherein the two transistors share the gate.

According to some embodiments, a transistor with a shared gate structure includes an active area and a gate. The active area has a body extending in a first direction on a substrate, and a protrusion extending in a second direction perpendicular to the first direction from a central portion of the body in the first direction. The gate is arranged above the active area to overlap a channel area of the active area, and has an inverted pi ( $\Pi$ ) structure that, from a plan view, surrounds on three sides but does not cover a portion of the active area that includes two corner portions of the active area. The active area is divided into a first active area and a second active area by a separation area extending in the second direction and separating the body and a portion of the protrusion. The protrusion is divided into a first portion separated into two sub-portions by the separation area and a second portion, wherein the first portion is between the body and the second portion in the second direction. Opposite ends of the body in the first direction corresponding to two drain areas, the second portion of the protrusion corresponding to a common source area, and the gate constitute two transistors, wherein the two transistors share the gate.

According to some embodiments, a semiconductor device includes a shared gate structure. The semiconductor device may include an active area having a first active area portion extending in a first direction parallel to a top surface of a substrate, and a protrusion protruding from the first active area portion and extending in a second direction perpendicular to the first direction and parallel to the top surface of the substrate. A separation area may extend in the second direction from a first end to a second end and which divides the first active area portion into a first active portion on a first side of the separation area and a second active portion on a second, opposite side of the separation area, and which divides a first portion of the protrusion into a first protrusion part on the first side of the separation area and a second protrusion part on the second side of the separation area, wherein the first end of the separation area is on the active area and the second end of the separation area is on the first portion of the protrusion. Two 3D corner portions of the active area may be adjacent to the first end of the separation area, and a gate may be arranged above the active area to cover a channel area of the active area while exposing the two 3D corner portions. In various embodiments, the separation area extends in the second direction beyond a first edge of the gate, and also extends beyond a second edge of the gate opposite the first edge in the second direction. Also, part of the gate extends beyond the separation area and beyond the active area in the second direction, and the two 3D corner portions may be between a first portion of the gate and a second portion of the gate in the first direction.

According to some embodiments, a sub-word line driver includes: a first sub-word line driver having a first transistor for supplying a negative voltage to a first word line in response to a driving signal; and a second sub-word line driver having a second transistor for supplying the negative voltage to a second word line in response to the driving signal, wherein the first transistor and the second transistor constitute a transistor unit, the transistor unit includes a gate having an inverted pi ( $\Pi$ ) shape, and the first and second transistors share the gate.

According to some embodiments a sub-word line driver includes: a cell area in which a plurality of memory cells are arranged in a two-dimensional array structure; and a core/peri area around the cell area and including driving circuits for driving the memory cells, wherein a sub-word line driver, which is one of the driving circuits, is in the core/peri area and includes: a first sub-word line driver having a first transistor for supplying a negative voltage to a first word line in response to a driving signal; and a second sub-word line driver having a second transistor for supplying the negative voltage to a second word line in response to the driving signal, wherein the first transistor and the second transistor constitute a transistor unit, the transistor unit includes a gate having an inverted pi ( $\Pi$ ) shape, and the first and second transistors share the gate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
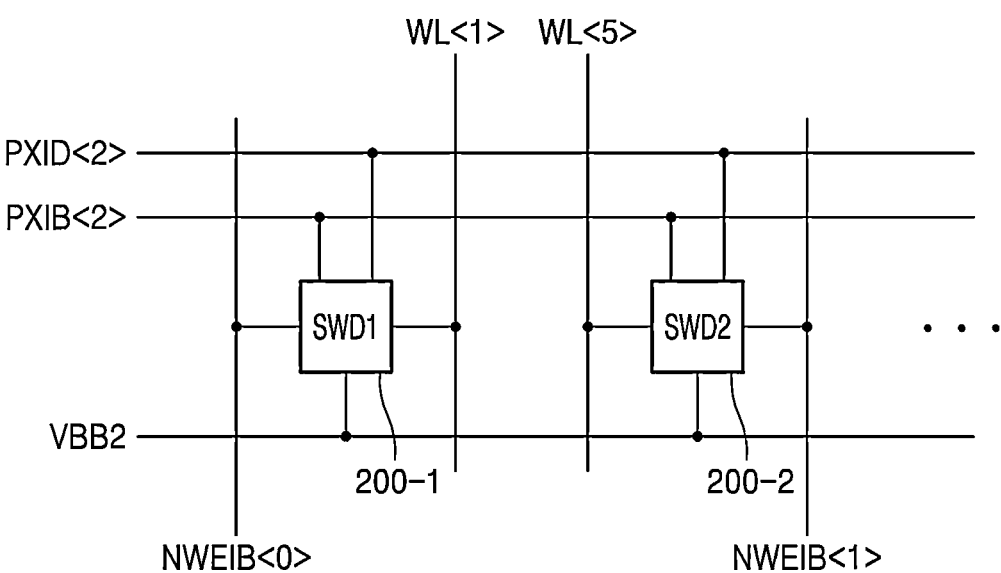
FIGS. 1A and 1B are block diagrams and circuit diagrams, respectively, of sub-word line drivers according to an embodiment.

Hereinafter, the present disclosure will be described in detail with reference to the accompanying drawings. Like reference numerals in the drawings denote like elements, and thus their overlapped explanations are omitted.

Figure 1B:
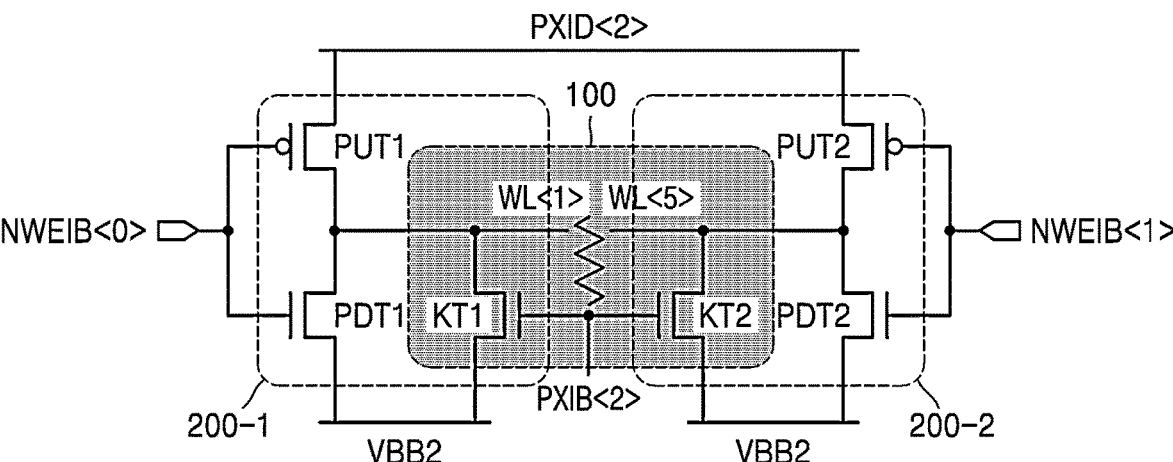

FIGS. 1A and 1B are block diagrams and circuit diagrams, respectively, of sub-word line drivers according to an embodiment.

Referring to FIGS. 1A and 1B, each of sub-word line drivers 200-1 and 200-2 according to the present embodiment may include three transistors. For example, the first sub-word line driver 200-1 may include a first pull-up transistor PUT1, a first pull-down transistor PDT1, and a first transistor KT1, and the second sub-word line driver 200-2 may include a second pull-up transistor PUT2, a second pull-down transistor PDT2, and a second transistor KT2. As can be seen, ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Operations of the sub-word line drivers 200-1 and 200-2 according to the present embodiment will be described as follows. The sub-word line drivers 200-1 and 200-2 may receive driving signals PXID<2> and PXIB<2> from a driving voltage generator (see 400-1 of FIG. 11B). The first sub-word line driver 200-1 may be activated in response to a word line enable signal NWEIB<0>, and the second sub-word line driver 200-2 may be activated in response to a word line enable signal NWEIB<1>. In more detail, when the word line enable signal NWEIB<0> is provided at a lower level, the first sub-word line driver 200-1 may provide a high voltage VPP provided through a driving signal PXID<2> to a word line WL<1>. In addition, when the word line enable signal NWEIB<0> is provided at a higher level, the first sub-word line driver 200-1 may block the driving signal PXID<2> and precharge the word line WL<1> with a negative voltage VBB2. Likewise, when the word line enable signal NWEIB<1> is provided at a lower level, the second sub-word line driver 200-2 may provide the high voltage VPP provided through the driving signal PXID<2> to a word line WL<5>. In addition, when the word line enable signal NWEIB<1> is provided at a higher level, the second sub-word line driver 200-2 may block the driving signal PXID<2> and precharge a word line WL<5> with the negative voltage VBB2.

The sub-word line drivers 200-1 and 200-2 may include transistors KT1 and KT2 for maintaining the word lines WL<1> and WL<5> at the negative voltage VBB2 after the precharge. In consideration of functional aspects of the transistors KT1 and KT2, they are also referred to as keeping transistors. The transistors KT1 and KT2 may fix the word lines WL<1> and WL<5> to the level of the negative voltage VBB2 in response to the driving signal PXIB<2>. Accordingly, the word lines WL<1> and WL<5> may maintain a stable voltage value even with fluctuations in the level of the word line enable signals NWEIB<0> and NWEIB<1> or noise.

As shown in FIG. 1B, the transistors KT1 and KT2 of the sub-word line drivers 200-1 and 200-2 may constitute a transistor unit 100, also described as a transistor structure. The transistor unit 100 may be a transistor circuit and may include a common source electrode (see 140S in FIG. 2) to which the negative voltage VBB2 is applied, a common gate electrode (see 140G in FIG. 2) to which the driving signal PXIB<2> is applied, and two drain electrodes (see 140D in FIG. 2) respectively connected to the word lines WL<1> and WL<5>.

In the transistor unit 100, an active area (see 110 in FIG. 2) constituting source, drain, and channel areas (S, D, C) have a structure separated by a separation area (see 130 in FIG. 2), so that the first transistor KT1 and the second transistor KT2 may have a channel structure separated from each other, and repairs may be separated from each other and managed. In FIG. 1B, the zigzag shape means that the active area 110 has a channel separated by the separation area 130. Each of the first transistor KT1 and the second transistor KT2 has a "T"-shaped channel (also described as L-shaped), thereby maximizing a length of the channel, thereby improving the heat resistance performance for a high voltage and reducing a short channel effect. Furthermore, in the transistor unit 100, a gate (see 120 in FIG. 2) above the active area has an inverted pi ( $\sqcap$ ) shape, thereby effectively preventing a gate oxide layer from bursting due to a field, such as an E-field. The gate is concentrated at an edge portion adjacent to the separation area 130. The structure of the transistor unit 100 will be described in more detail in the description of FIGS. 2 to 3C.

As shown in FIG. 1B, the sub-word line drivers 200-1 and 200-2 may have circuit structures for driving the word lines WL<1> and WL<5>, respectively. In particular, the transistors KT1 and KT2 of the sub-word line drivers 200-1 and 200-2 may share a gate to configure the transistor unit 100.

Figure 11A:
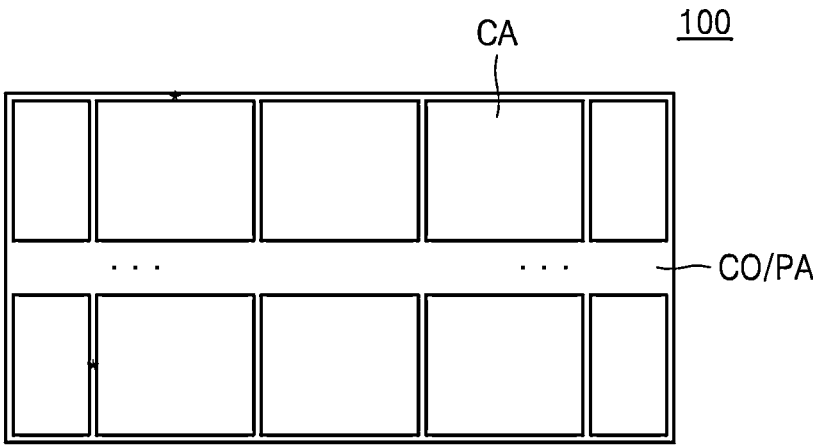
FIGS. 11A and 11B are a plan view of a semiconductor device according to an embodiment and a block diagram illustrating a structure of a portion of the semiconductor device, respectively.
Figure 11B:
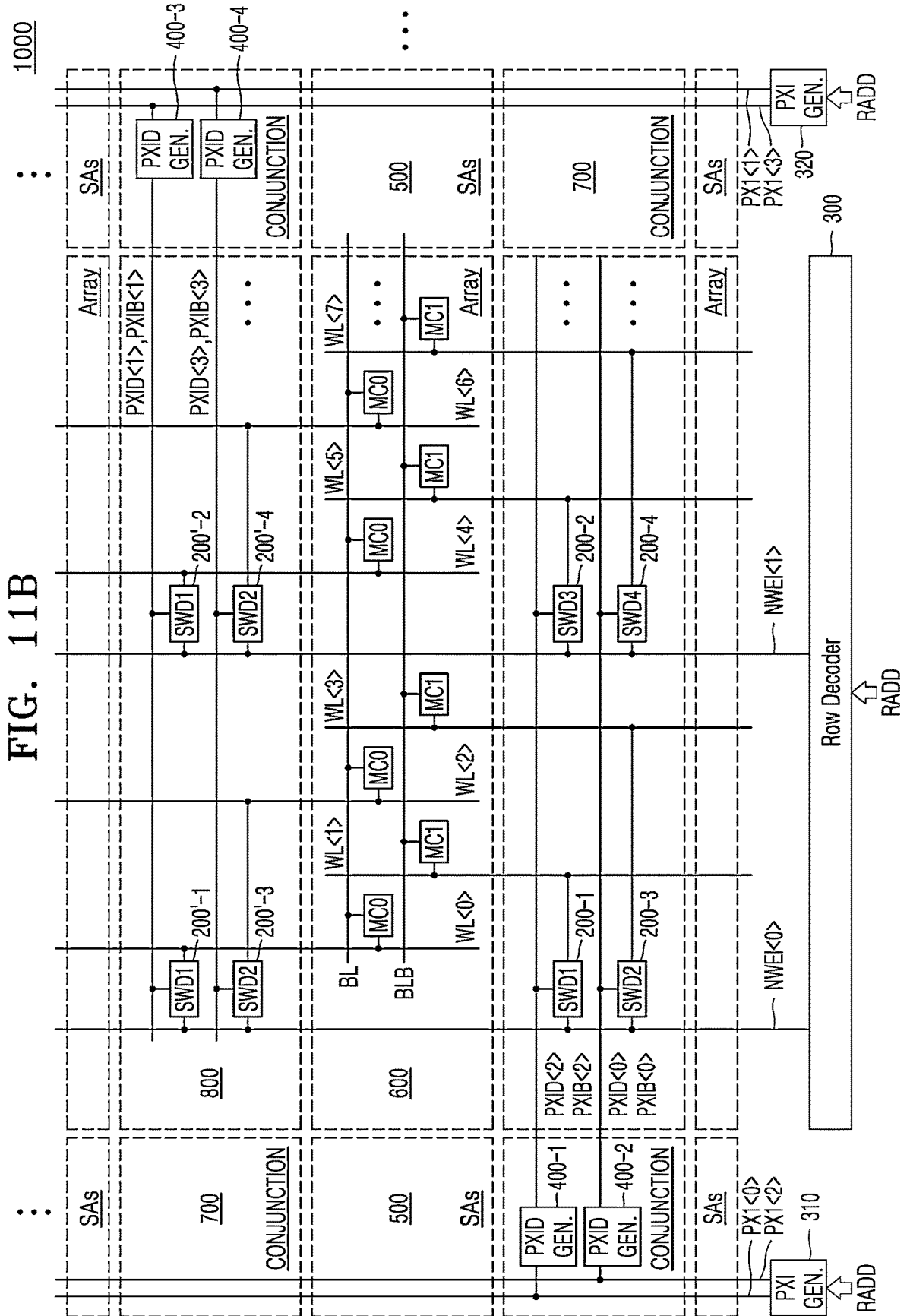

The first sub-word line driver 200-1 may receive the driving signals PXID<2> and PXIB<2> from the driving voltage generator 400-1 and may receive the word line enable signal NWEIB<0> from a row decoder (see 300 in FIG. 11B). As described above, the first sub-word line driver 200-1 may include the pull-up transistor PUT1, the pull-down transistor PDT1, and the first transistor KT1. The pull-up transistor PUT1 may pull up the word line WL<1> to the level of the driving signal PXID<2> in response to the word line enable signal NWEIB<0>. On the other hand, the pull-down transistor PDT1 may pull down the word line WL<1> to the negative voltage VBB2 in response to the word line enable signal NWEIB<0>. The first transistor KT1 may maintain the voltage of the word line WL<1> at the level of the negative voltage VBB2 when the word line WL<1> is inactivated. To this end, the first transistor KT1 may switch between a source provided with the negative voltage VBB2 and a drain connected to the word line WL<1> in response to the driving signal PXIB<2> that is in a complementary relationship with the driving signal PXID<2>.

The second sub-word line driver 200-2 may receive the driving signals PXID<2> and PXIB<2> from the driving voltage generator 400-1 and may receive the word line enable signal NWEIB<1> from the row decoder 300. As described above, the second sub-word line driver 200-2 may include the pull-up transistor PUT2, the pull-down transistor PDT2, and the second transistor KT2. The pull-up transistor PUT2 may pull up the word line WL<5> to the level of the driving signal PXID<2> in response to the word line enable signal NWEIB<1>. On the other hand, the pull-down transistor PDT2 may pull down the word line WL<5> to the level of the negative voltage VBB2 in response to the word line enable signal NWEIB<1>. The second transistor KT2 may maintain the voltage of the word line WL<5> as the negative voltage VBB2 when the word line WL<5> is inactivated. To this end, the second transistor KT2 may switch between a source provided with the negative voltage VBB2 and a drain connected to the word line WL<5> in response to the driving signal PXIB<2> that is in a complementary relationship with the driving signal PXID<2>.

The transistors KT1 and KT2 of the sub-word line drivers 200-1 and 200-2 according to the present embodiment may receive an identical gate voltage corresponding to one driving signal PXIB<2> by sharing a gate. In addition, the first transistor KT1 and the second transistor KT2 share a common source area 110S, so that the same negative voltage VBB2 may be provided to the common source area 110S.

In the sub-word line drivers 200-1 and 200-2 of the present embodiment, each of the transistors KT1 and KT2 constituting the transistor unit 100 has a "T"-shaped channel, so that a length of the channel may be kept relatively long. This shape may also be described as a "L" shape, or a 90° corner shape, for example, including two straight linear portions arranged to meet each other at a 90° angle, where one straight linear portion is longer than the other. In addition, because the active area 110 has a structure separated by the separation area 130, repairs of the transistors KT1 and KT2 may be separated and managed. Furthermore, because the gate 120 above the active area has an inverted pi ( $\sqcap$ ) shape, a problem in which a gate oxide layer is burst due to concentration of a field at an edge portion adjacent to the separation area 130 can be effectively prevented. The inverted pi ( $\sqcap$ ) shape can also be described as a 3-sided open polygon shape, or 3-sided open rectangle shape, having first and second sides each extending in a first direction substantially parallel to a direction in which the separation area 130 extends and disposed opposite each other with the separation area 130 in between, and a third side connecting and extending substantially perpendicular to the first and second sides, and crossing the separation area 130. Further details of the 3-sided open rectangle-shaped gate 120 will be described in more detail below. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 2:
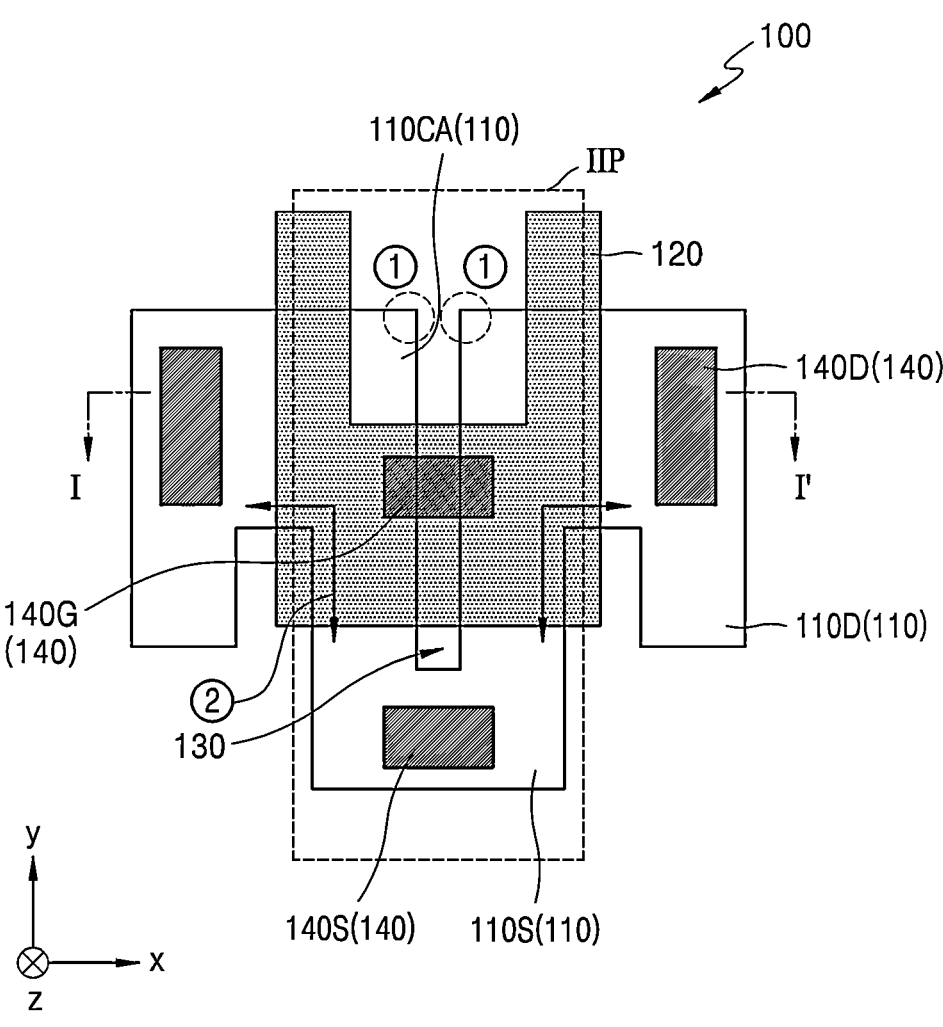
FIG. 2 is a plan view of a portion of a transistor unit according to an embodiment.
Figure 3A:
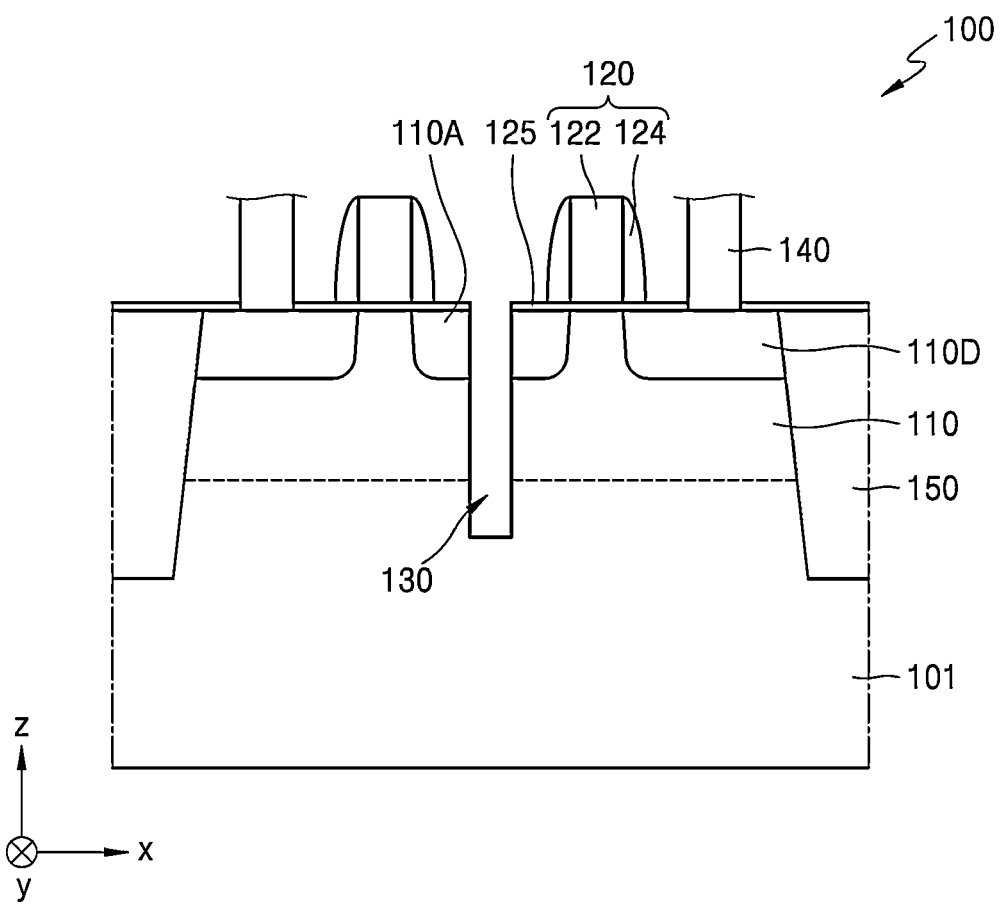
FIGS. 3A to 3C are a cross-sectional view taken along line I-I' of FIG. 2, a plan view of an active area, and a plan view of a gate, respectively.
Figure 3B:
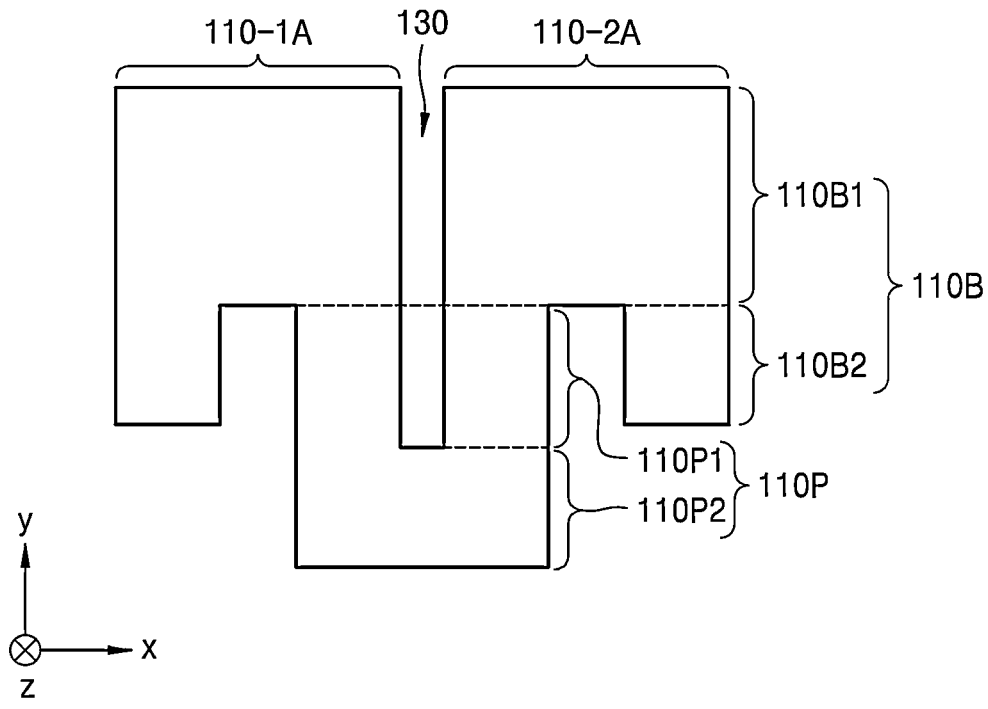
Figure 3C:
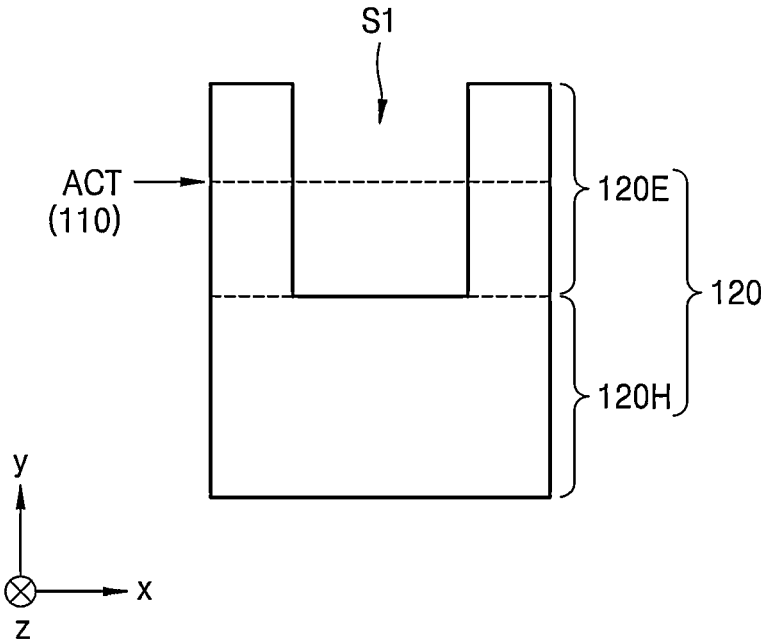

FIG. 2 is a plan view of a portion of a transistor unit according to an embodiment, and FIGS. 3A to 3C are a cross-sectional view taken along line I-I' of FIG. 2, a plan view of an active area, and a plan view of a gate, respectively. They are described with reference to FIGS. 1A and 1B together, and contents already described in the description of FIGS. 1A and 1B will be simply described or omitted.

Referring to FIGS. 2 to 3C, the transistor unit 100 according to the present embodiment may include the active area 110, the gate 120, and the separation area 130.

The active area 110 may be formed on a substrate 101. The substrate 101 may include or be formed of, for example, a semiconductor element such as silicon or germanium (Ge). In addition, the substrate 101 may include or be formed of a compound semiconductor such as silicon carbide (SiC), gallium arsenide (GaAs), indium arsenide (InAs), or indium phosphide (InP). The substrate 101 may have a silicon on insulator (SOI) structure. For example, the substrate 101 may include a buried oxide (BOX) layer. A conductive area, for example, a well doped with impurities or a semiconductor structure doped with impurities may be formed in an upper portion of the substrate 101. For example, a well or an upper portion of the well may constitute the active area 110. Various device separation structures 150, also described as isolation layers, such as a shallow trench separation (STI) structure may be formed on the substrate 101.

When viewed in a plan view as in FIG. 2 or 3B, the active area 110 may generally have a "T" shape (also written as a "T-shape") having a vertical portion that includes the separation area 130 therein and a horizontal portion that includes two hanging extension portions. Described in another way, the active area 110 may largely include a body 110B and a protrusion 110P. The body 110B may have a shape extending in a first direction (x-direction), and may be divided into a central body 110B1 and an extension 110B2. The extension 110B2 may extend in a second direction (y-direction) from both ends of the central body 110B1 in the first direction (x-direction). The protrusion 110P may extend away from the body 110B in the second direction (y-direction) from a central portion of the body 110B in the first direction (x-direction, e.g., the central portion is central with respect to the x-direction). The protrusion 110P may be divided into a first portion 110P1 separated by the separation area 130 and a second portion 110P2 that is not separated by the separation area 130. The body 110B forms a top of a "T" shape, and the protrusion 110P forms a trunk of the "T" shape. As can be seen in this embodiment and other embodiments, the inverted pi ( $\amalg$ ) shape of the gate 120 is inverted with respect to the "T" shape of the active area 110, such that when the active area is oriented to form the "T" shape in a right-side up manner, in relation to the "T" shape, the gate 120 has an inverted pi ( $\amalg$ ) shape. Accordingly, the separation area 130 extends in the second direction (y-direction) through the body 110B to have a first end in the protrusion 110P and a second end in the body 110B and opposite the first end in the second direction. The separation area 130 separates the body 110B into two portions and separates a first portion of the protrusion 110P into two parts, one part on each side of the separation area 130.

The common source area 110S and a drain area 110D doped with a high concentration of impurity ions may be formed in an upper portion of the active area 110. The common source area 110S and the drain area 110D may be formed through an ion implant process using an implant mask IIP indicated in FIG. 2 by dashed lines. The common source area 110S and the drain area 110D may be formed through separate implant processes. For example, the drain area 110D may be formed through an ion implant process using a first type of implant mask IIP covering the common source area 110S, and the common source area 110S may be formed through the ion implant process using a second type of implant mask IIP that opens the common source area 110S opposite to the first type. Meanwhile, when the common source area 110S is formed, impurity ions may also be doped in a channel-avoidance area 110CA.

The separation area 130 may have a shape extending from the central portion of the body 110B of the active area 110 in the first direction (x-direction) to the second portion 110P2 of the protrusion 110P downward in the second direction (y-direction). In addition, upper and lower portions of the separation area 130 in the second direction (y-direction) may not be covered by the gate 120 in a third direction (z-direction). In more detail, the upper portion of the separation area 130 in the second direction (y-direction) may be exposed from the gate 120 together with the channel-avoidance area 110CA (see FIG. 2) due to the inverted pi ( $\amalg$ ) shape of the gate 120. In addition, a lower portion of the separation area 130 in the second direction (y-direction) extends to the outside of the gate 120, and thus, may be exposed from the gate 120 in a form protruding from a lower surface of the gate 120. When viewing from a plan view, considering the active area 110 as oriented to form a T shape, the two vertical legs of the inverted pi ( $\amalg$ )-shaped gate 120 extend beyond a top of the T shape, and the connecting portion of the inverted pi ( $\amalg$ ) shape overlaps a middle vertical portion of the T shape. In this manner, corners at the top the T shape where the separation area 130 is formed are not covered in the third direction (z-direction) by the gate 120. The gate 120 is arranged above the active area 110 in the third direction (z-direction) perpendicular to the first and second directions, to cover the channel area of the active area 110. The gate has a structure that exposes a top of the active area 110 with respect to the gate 120 (when viewed in a plan view), at a channel-avoidance area 110CA (also described as a channel-avoidance region) of the active area 110 adjacent to the second end of the separation area 130.

As can be seen through FIG. 3B, the active area 110 may be divided into a first active area 110-1A and a second active area 110-2A by the separation area 130. For example, the central body 110B1 of the body 110B and the first portion 110P1 of the protrusion 110P may be divided into two parts by the separation area 130. Because the active area 110 is divided into the first active area 110-1A and the second active area 110-2A through the separation area 130, channel separation may be achieved. For example, the transistor unit 100 may include two channels divided into a channel toward the first active area 110-1A and a channel toward the second active area 110-2A.

For reference, when the channels are not separated or are separated indefinitely, even if a defect such as a word line bridge occurs only in one of drains, it is generally impossible to distinguish a repair address, and thus, both word lines need to be repaired. Accordingly, repair resources need to be used twice, which may eventually lead to a drop in yield. On the other hand, in the case where the separation of the channels is assured, when a defect occurs in one of the drains, only the corresponding word line needs to be repaired, so that the use of repair resources may be halved, and thus, a decrease in yield may be prevented.

The separation area 130 may have a depth sufficient to separate (e.g., electrically separate) the active area 110, as illustrated in FIG. 3A. For example, the separation area 130 may have a depth of several hundred nm or more. However, the depth of the separation area 130 is not limited thereto. Although not shown, the separation area 130 may be filled with an insulating layer such as a silicon oxide film, a silicon nitride film, or a silicon oxynitride film. In addition, areas outside the active area 110 and the gate 120 in FIG. 2 may also be filled with an insulating layer.

The gate 120 may be formed above the active area 110. The gate 120 may include a gate electrode 122 and a spacer 124. A gate oxide layer 125 may be between the gate 120 and the active area 110. The gate oxide layer 125 may be formed as an interface layer and/or a high dielectric layer. As shown in FIG. 3A, the gate oxide layer 125 may also be formed on an upper surface of the active area 110 and the device separation structure 150 other than a lower portion of the gate 120. However, according to an embodiment, the gate oxide layer 125 may be formed only on the active area 110 below the gate 120.

The gate electrode 122 may include or be formed of a conductive material such as polysilicon or metal. In addition, the gate electrode 122 may be formed as a single layer or multiple layers. When the gate electrode 122 is formed as multiple layers and includes a metal layer, the gate electrode 122 may include, for example, a first metal layer, a work-function control layer, and a second metal layer. The first metal layer may be a lower metal layer including Ti, Ta, or the like. The work-function control layer is a metal layer including a work-function material such as Al, and may supply a work-function material to an interface between the high dielectric layer and the first metal layer. The second metal layer is an upper metal layer on the work-function control layer, and may include an n-type metal constituting a gate of an n-channel MOSFET (NMOS) or a p-type metal constituting a gate of a p-channel MOSFET (PMOS). According to an embodiment, the gate electrode 122 may further include a gap-fill metal layer.

When viewed in a plan view as in FIG. 2 or 3C, the gate 120 may have a substantially inverted pi ($\Pi$) shape. In more detail, the gate 120 may include a head 120H and two ears 120E. Head 120H may also be described as a body, or a crossbeam portion. Ears 120E may also be described as legs or extension portions, extending from the body or crossbeam portion. In one embodiment, the head 120H has a rectangular shape and may cover a portion of the body 110B and a portion of the first part 110P1 of the protrusion 110P. In addition, the head 120H may cover a portion of the separation area 130 corresponding to the portion of the body 110B and the portion of the first part 110P1.

The two ears 120E may have an elongated rectangular shape extending upward in the second direction (y-direction) from both ends of the head 120H in the first direction (x-direction). The two ears 120E may cover a portion of the body 110B and extend upward in the second direction (y-direction) to the outside of the body 110B. Dashed lines indicated by ACT in FIG. 3C may correspond to the boundary of the active area 110. In one embodiment, the channel-avoidance area 110CA may be exposed between the two ears 120E. That is, the channel-avoidance area 110CA (see FIG. 2) is not covered by the gate 120. A space between the two ears 120E may have a rectangular first shape S1.

In the transistor unit 100 of the present embodiment, because the gate 120 is not above the channel-avoidance area 110CA, the channel-avoidance area 110CA may avoid a channel function. When there is a gate portion between the ears 120E, a portion of the active area 110 corresponding to the channel-avoidance area 110CA may function as a channel, and an E-field may be applied to the portion of the active area 110 through the gate 120. In general, the E-field has a characteristic that is concentrated on the edge portion, and thus, may be concentrated on corner portions (①) indicated by dashed lines. Accordingly, a defect may occur in which a gate oxide layer arranged on the corner portions (①) bursts. On the other hand, in the case of the transistor unit 100 of the present embodiment, the gate 120 has an inverted pi ($\Pi$) shape, and by exposing the channel-avoidance area 110CA without covering the same, the channel-avoidance area 110CA does not function as a channel, and defects such as bursting of a gate oxide layer due to concentration of the E-field may be prevented.

The shape of the gate 120 has been described with reference to FIGS. 2, 3A, and 3C, but is not limited thereto. Various types of the gate 120 will be described in more detail in the description of FIGS. 7A to 7F.

A contact 140 may be formed on the active area 110 and the gate 120. In more detail, a source contact 140S electrically connected to the common source area 110S may be formed, two drain contacts 140S electrically and respectively connected to two drain areas 110D may be formed, and a gate contact 140G electrically connected to the gate 120 may be formed.

The transistor unit 100 of the present embodiment may include two transistors. For example, the common source area 110S, the drain area 110D on the left, and the gate 120 may constitute a first transistor (see TK1 in FIG. 1B), and the common source area 110S, the drain area 110D on the right, and the gate 120 may constitute a second transistor (see TK2 in FIG. 1B). On the other hand, each of the first transistor TK1 and the second transistor TK2 may have a "T"-shaped channel (②), also described as an "L"-shaped channel, or a corner-shaped channel, as indicated by both curved arrows, and thus, a length of the channel may be kept relatively long.

The transistor unit 100 of the present embodiment includes two transistors, includes the common source area 110S, and shares the gate 120, thereby minimizing the size of the two transistors. In addition, because channels of the active area 110 are separated by the separation area 130, repairs of the two transistors may be separated and effectively managed. Furthermore, by maximizing a channel length of each of the two transistors in the form of "T", the heat resistance performance for a high voltage and short channel effect for a high voltage may be improved. Meanwhile, in the transistor unit 100 the present embodiment, because the gate 120 above the active area 110 has an inverted pi ($\Pi$) shape, a problem in which a gate oxide layer is burst due to concentration of an E-field at an edge of the active area 110 adjacent to the separation area 130 may be effectively prevented.

Figure 4A:
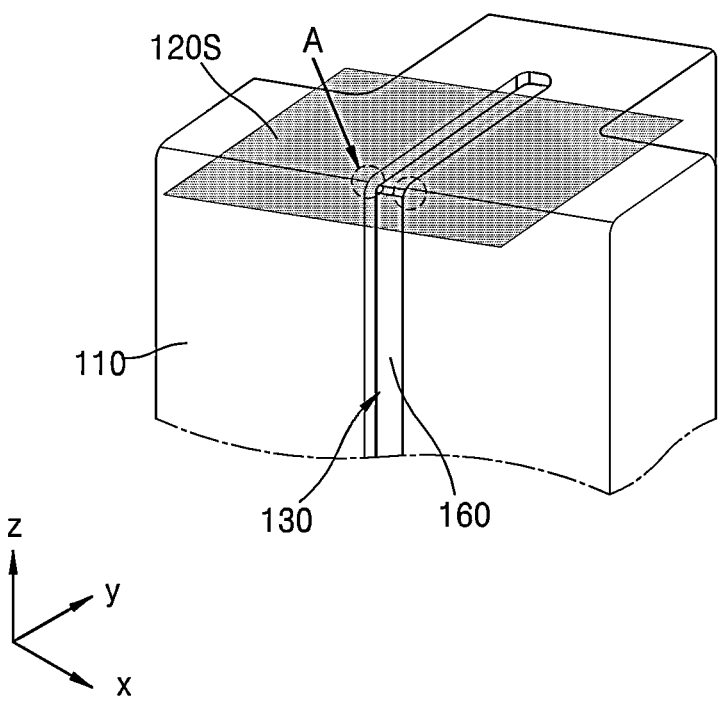
FIGS. 4A to 5B are perspective views and SEM photographs, respectively, for explaining an advantage of an inverted pi ( $\Pi$ )-shaped gate in a transistor unit of some embodiments.
Figure 4B:
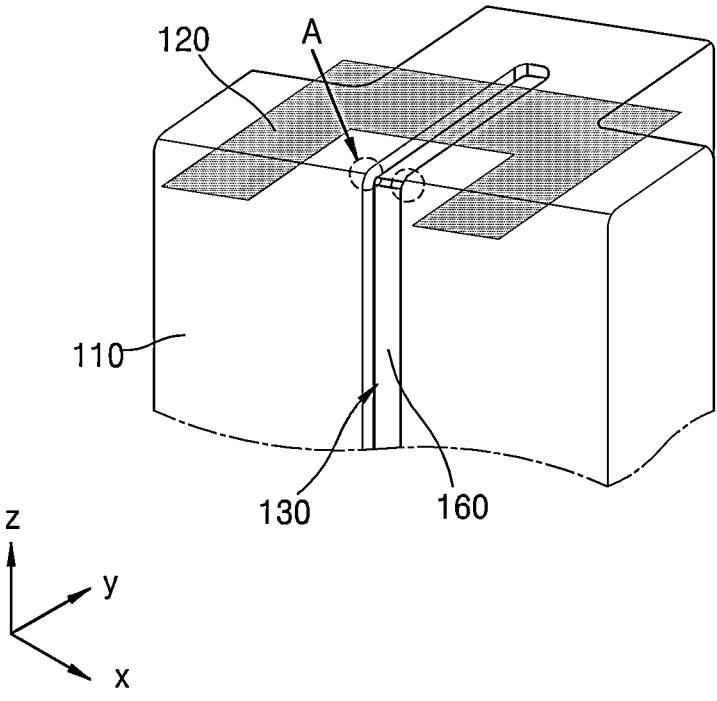
Figure 5A:
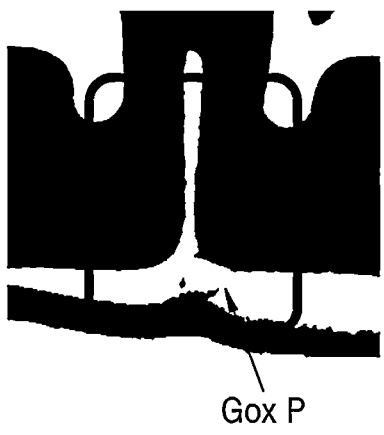
Figure 5B:
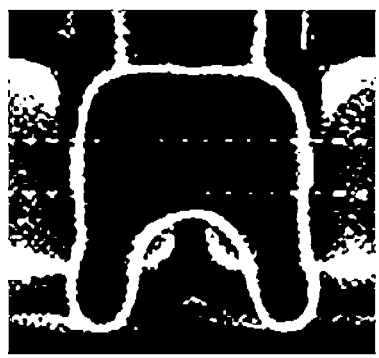

FIGS. 4A to 5B are perspective views and SEM photographs, respectively, for explaining an advantage of an inverted pi ($\Pi$)-shaped gate in a transistor unit of the present embodiment, wherein FIGS. 4A and 5A are a perspective view and an SEM photograph, respectively, of a transistor unit having a rectangular gate, and FIGS. 4B and 5B are a perspective view and an SEM photograph, respectively, of a transistor unit of the present embodiment having an inverted pi ($\Pi$)-shaped gate.

Referring to FIGS. 4A to 5B, as shown in FIG. 4A, when a gate 120S has a rectangular shape and is above the active area 110, an E-field may be concentrated at a field concentration point A indicated by a dashed circle. The field concentration point A may be, for example, a 3D edge portion of the active area 110 adjacent to the separation area 130 (e.g., a corner portion). Accordingly, in FIG. 5A, as indicated by 'Gox P', a defect in which a gate oxide layer bursts at the field concentration point A may occur.

On the other hand, as in the transistor unit 100 of the present embodiment of FIG. 4B, when the gate 120 has an inverted pi ($\Pi$) shape and is above the active area 110, the E-field may no longer be concentrated at the field concentration point A. Accordingly, as shown in FIG. 5B, a defect in which a gate oxide layer bursts at the field concentration point A may not occur. As shown in FIGS. 4A and 4B, the separation area 130 may be filled by a separation insulating layer 160.

Figure 6:
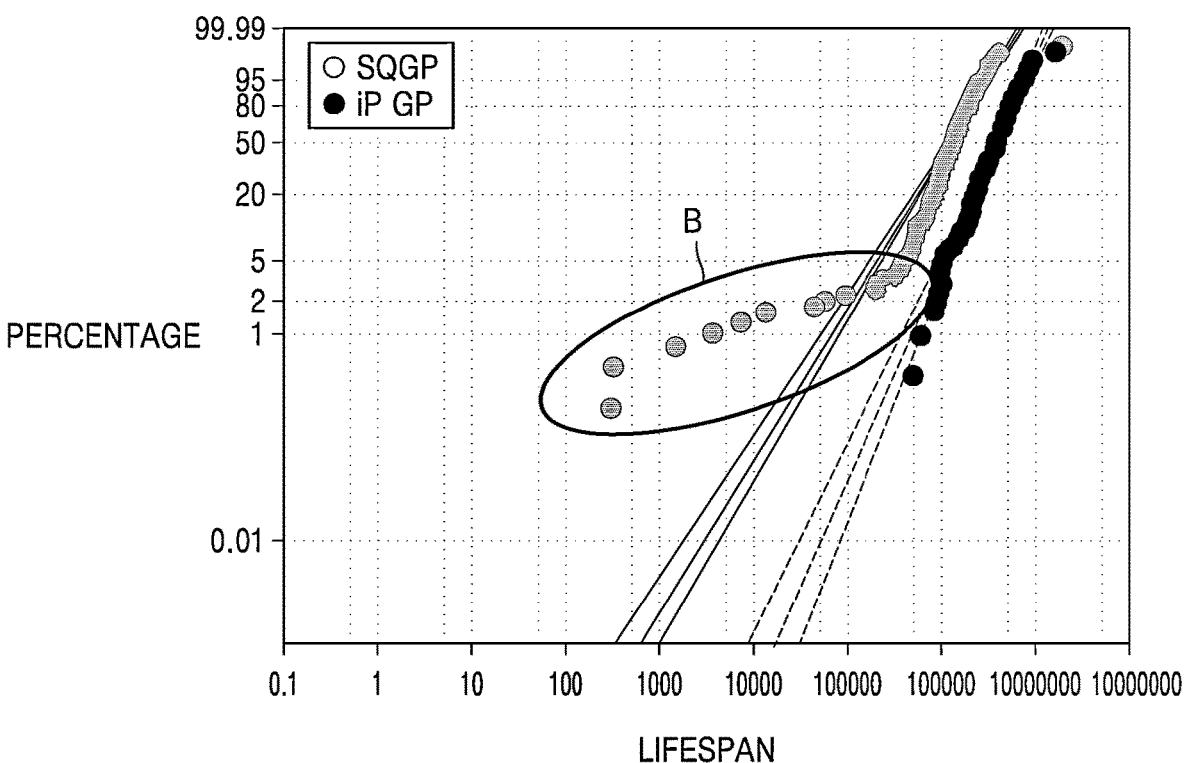
FIG. 6 is a graph illustrating a result of measuring a time dependent dielectric breakdown (TDDB) using a driving signal PXIB for transistor units of some embodiments and a comparative example.

FIG. 6 is a graph illustrating a result of measuring a time dependent dielectric breakdown (TDDB) using a driving signal PXIB for transistor units of the present embodiment and a comparative example, wherein SQGP denotes a transistor unit of the comparative example including a rectangular gate, and iP denotes transistor units of the present embodiment including an inverted pi ( $\Pi$ )-shaped gate. An x-axis is a lifespan, units are years, and a y-axis represents defects as a percentage.

Referring to FIG. 6, in the case of the transistor unit of the comparative example, as can be seen from portion B indicated by an ellipse of a solid line, it can be confirmed that quite a lot of defects appear in an early period. On the other hand, solid straight lines correspond to fitting lines for a graph of the transistor unit of the comparative example, and dashed straight lines correspond to fitting lines for a graph of the transistor unit of the present embodiment. Through the fitting lines, it can be predicted that a lifespan of the transistor unit of the present embodiment is increased by almost 15 times or more compared to the transistor unit of the comparative example.

FIGS. 7A to 7F are plan views of a portion of a transistor unit according to embodiments. Contents already described in the description of FIGS. 1A to 3C will be simply described or omitted. In all of FIGS. 7A to 7F as well as the embodiments previously discussed, the gate 120, 120*a*, etc., does not cover 3D corner portions of the active area 110 adjacent to the separation area 130. In addition, in all of these embodiments, the separation area 130 extends in a first, lengthwise direction parallel to a surface of the substrate 101 (e.g., the y-direction) beyond a first edge of the gate 120, 120*a*, etc., and also beyond a second edge of the gate opposite the first edge in the first, lengthwise direction. Furthermore, in each of these embodiments, part of the gate 120, 120*a*, etc., extends beyond the separation area 130 and beyond the active area 110 in the first direction.

Figure 7A:
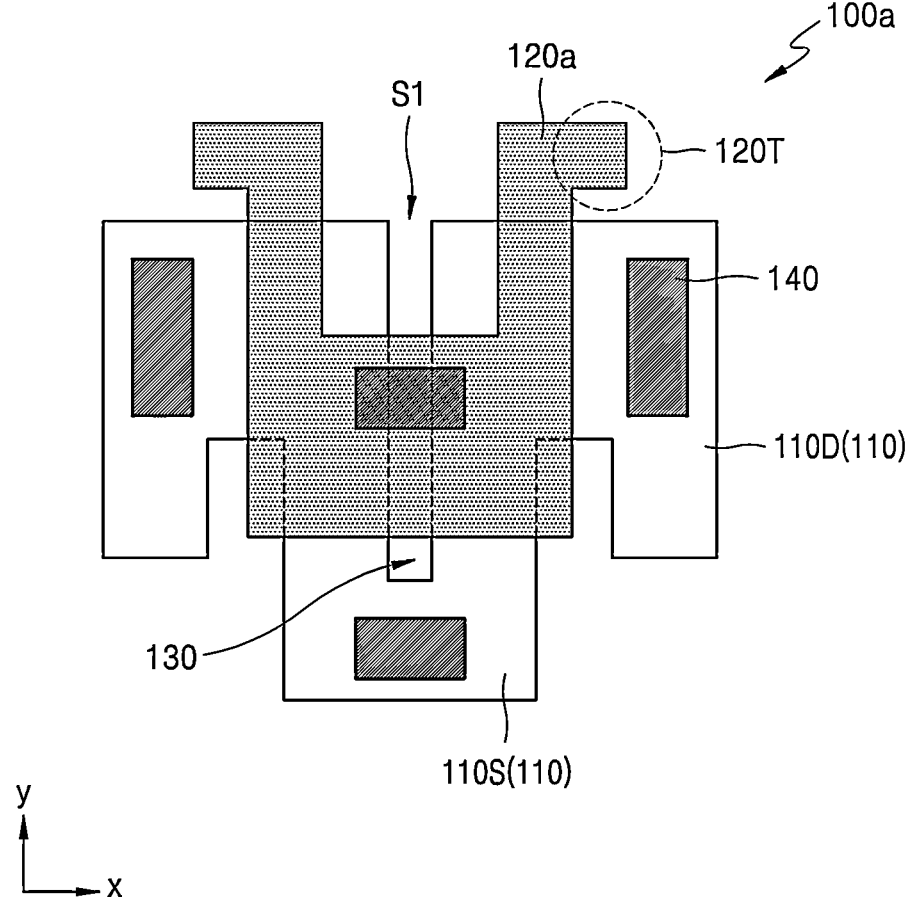
FIGS. 7A to 7F are plan views of a portion of a transistor unit according to embodiments.

Referring to FIG. 7A, a transistor unit 100*a* of the present embodiment may be different from the transistor unit 100 of FIG. 2 in the shape of a gate 120*a*. In more detail, in the transistor unit 100*a* of the present embodiment, the gate 120*a* may have a tab 120T formed at an end portion of an car (see 120E in FIG. 3C). For example, the gate 120*a* may include the tab 120T extending in the first direction (x-direction) from an end portion of the car 120E in the second direction (y-direction). The space between the two cars 120E may have the rectangular first shape S1 as in the transistor unit 100 of FIG. 2.

In the transistor unit 100*a* of the present embodiment, because the gate 120*a* includes the tab 120T at the end portion of the car 120E, a width in the first direction (x-direction) at the end portion of the car 120E may be greater than other portions of the car 120E. In this way, because the end portion of the car 120E of the gate 120*a* is formed wide, a length of a channel in a portion adjacent to the boundary of the active area 110 upward in the second direction (y-direction) may be secured to some extent. For example, when the car 120E is formed short in the second direction (y-direction) or the end portion of the car 120E outside the active area 110 is formed thin, due to the lack of margin in a manufacturing process, a channel may not be formed in a portion adjacent to the boundary of the active area 110 upward in the second direction (y-direction), or a defect may occur in that a channel is formed very short. On the other hand, when a width of the end portion of the car 120E outside the active area 110 is formed wide from the beginning, due to the sufficient margin in a manufacturing process, a sufficient channel length may be secured in a portion adjacent to the boundary of the active area 110 upward in the second direction (y-direction).

Figure 7B:
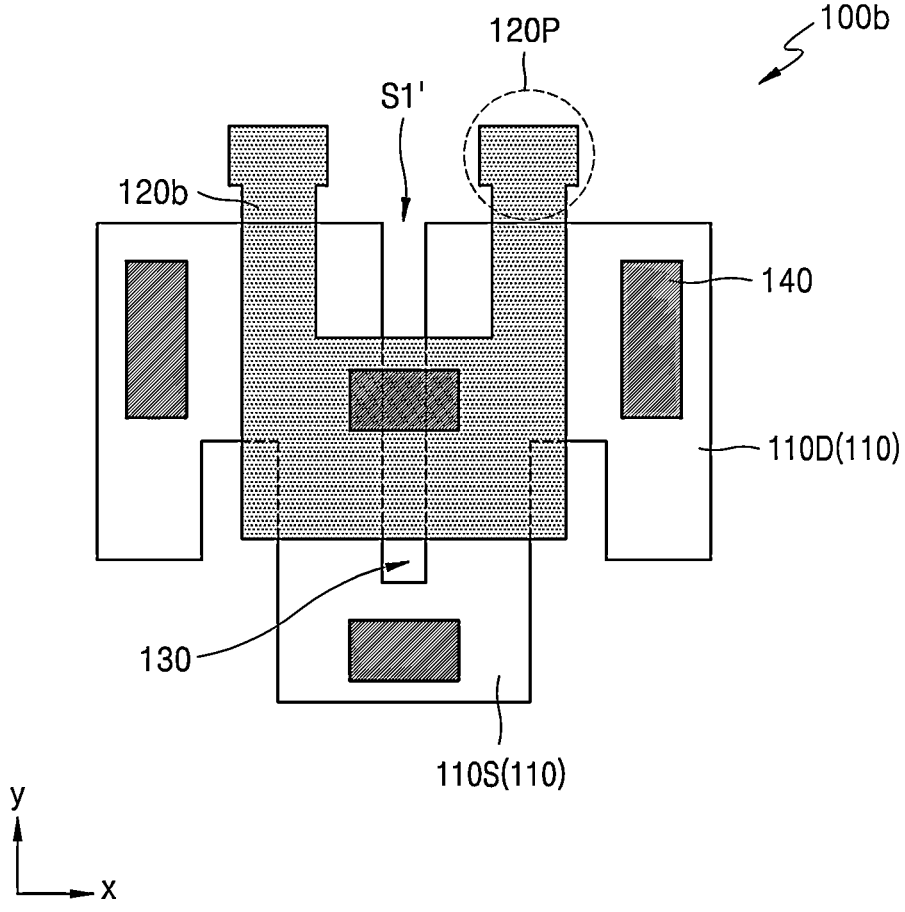

Referring to FIG. 7B, a transistor unit 100*b* of the present embodiment may be different from the transistor unit 100 of FIG. 2 in the shape of a gate 120*b*. In more detail, in the transistor unit 100*b* of the present embodiment, the gate 120*b* may include an extension 120P formed at the end portion of the car 120E. In addition, the space between the two cars 120E may have a first similar shape S1' similar to a rectangle.

In the transistor unit 100*b* of the present embodiment, the extension 120P may have a rectangular shape having a greater width in the first direction (x-direction) than other portions of the car 120E. Because the extension 120P is formed wide, similar to the gate 120*a* including the tab 120T in the transistor unit 100*a* of FIG. 7A, a channel length may be secured in a portion adjacent to the boundary of the active area 110 upward in the second direction (y-direction). Meanwhile, according to an embodiment, the extension 120P may be formed in a shape in which corner portions are curved, not in a rectangular shape.

Figure 7C:
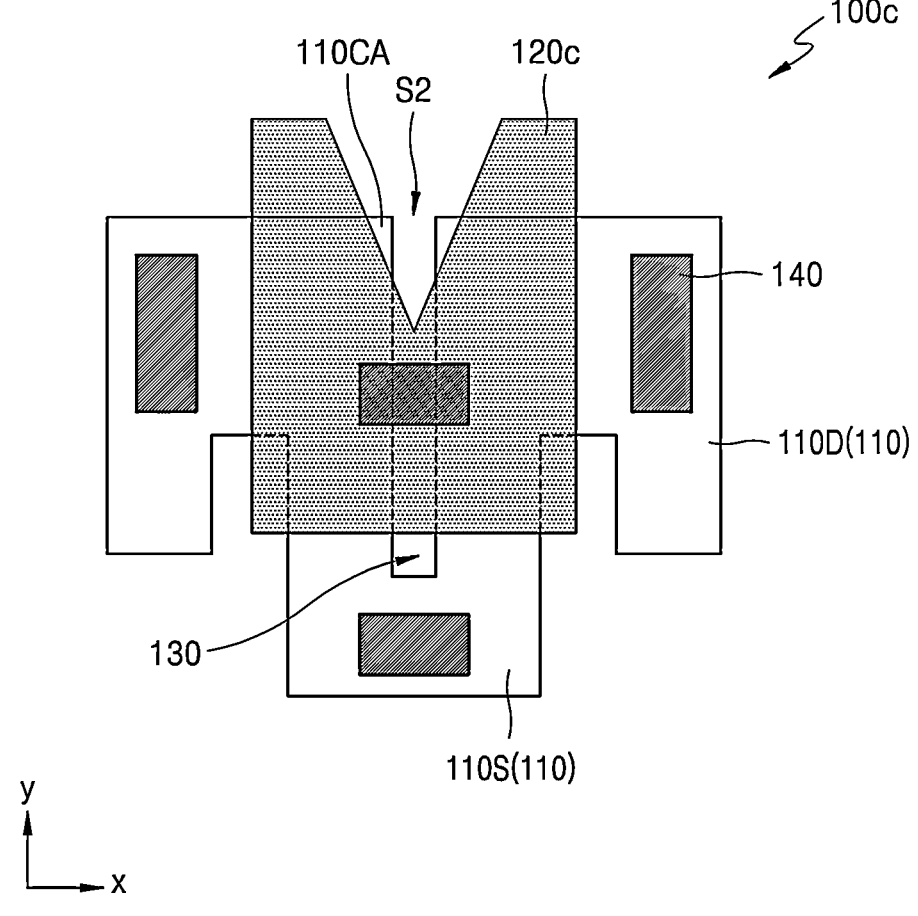

Referring to FIG. 7C, a transistor unit 100*c* of the present embodiment may be different from the transistor unit 100 of FIG. 2 in the shape of a gate 120*c*. In the transistor unit 100 of FIG. 2, the space between the two cars 120E of the gate 120 has the rectangular first shape S1. However, in the transistor unit 100*c* of the present embodiment, a space between the two cars 120E of the gate 120*c* may have a second shape S2, which may be triangular (e.g., an inverted triangle). Due to the shape of the space between the two cars 120E, the car 120E of the gate 120*c* may have a shape in which a width in the first direction (x-direction) decreases as the cars 120E go upward in the second direction (y-direction).

In the transistor unit 100*c* of the present embodiment, the size of the channel-avoidance area 110CA may be minimized. For example, the gate 120*c* may expose only a minimum portion of a 3D edge portion of the active area 110 where a gate oxide layer is most likely to burst. The portion of the active area 110 not covered by the gate 120*c* from a plan view may have a three-sided shape, for example, a triangular shape. Accordingly, the transistor unit 100*c* of the present embodiment may secure a channel length to some extent in a portion adjacent to the boundary of the active area 110 upward in the second direction (y-direction) due to the shape of the gate 120*c*.

Figure 7D:
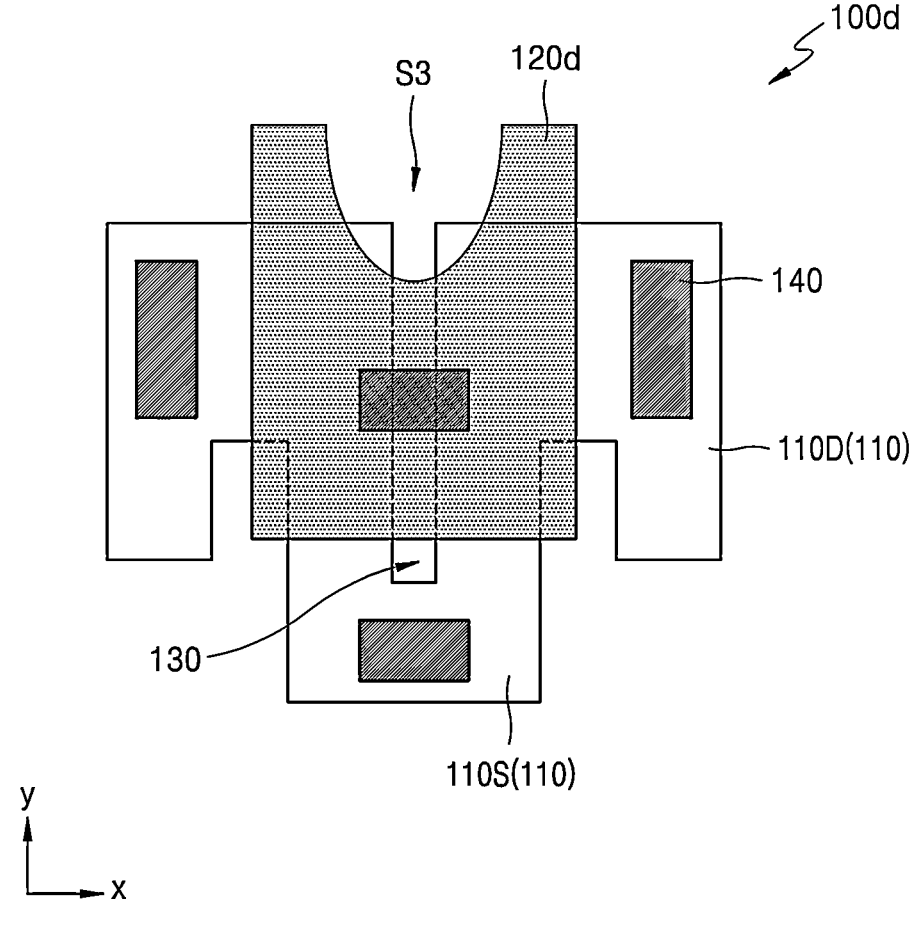

Referring to FIG. 7D, a transistor unit 100*d* of the present embodiment may be different from the transistor unit 100 of FIG. 2 in the shape of a gate 120*d*. In the transistor unit 100 of FIG. 2, the space between the two cars 120E of the gate 120 has the rectangular first shape S1. However, in the transistor unit 100*d* of the present embodiment, a space between the two cars 120E of the gate 120*d* may have a third shape S3 similar to a semicircle, half ellipse, or semi-oval. Also in the transistor unit 100*d* of the present embodiment, a width of the car 120E of the gate 120*d* in the first direction (x-direction) may decrease as the car 120E go upward in the second direction (y-direction). In addition, the gate 120*d* may expose only a minimum portion of a 3D edge portion of the active area 110 where a gate oxide layer is most likely to burst. The portion of the active area 110 not covered by the gate 120*d* from a top-down view may have a three-sided shape, for example, having two straight lines connected at a vertex and one curved line joining the two straight lines. Accordingly, the transistor unit 100*d* of the present embodiment may secure a channel length to some extent in a portion adjacent to the boundary of the active area 110 upward in the second direction (y-direction) due to the shape of the gate 120*d*.

Figure 7E:
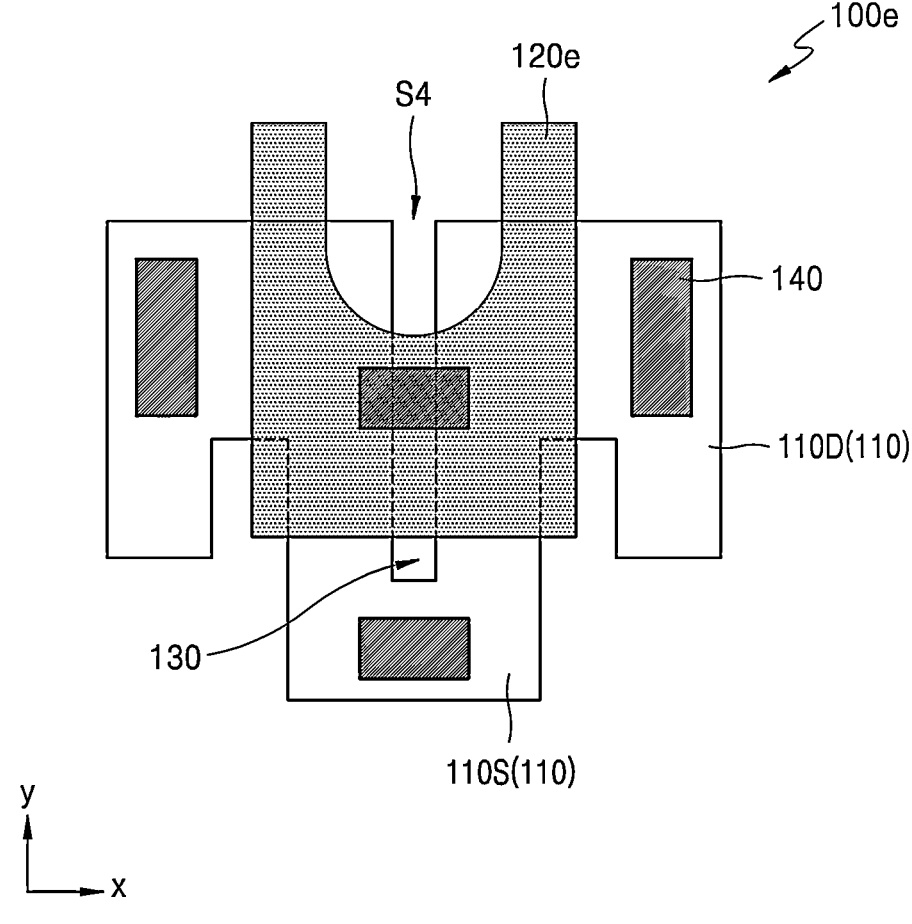

Referring to FIG. 7E, a transistor unit 100*e* of the present embodiment may be different from the transistor unit 100 of FIG. 2 in the shape of a gate 120*c*. In the transistor unit 100 of FIG. 2, the space between the two cars 120E of the gate 120 has the rectangular first shape S1. However, in the transistor unit 100e of the present embodiment, a space between the two cars 120E of the gate 120e may have a fourth shape S4 including a semicircle shape at a lower portion in the second direction (y-direction) and straight line shapes parallel to each other at an upper portion in the second direction (y-direction).

Figure 7F:
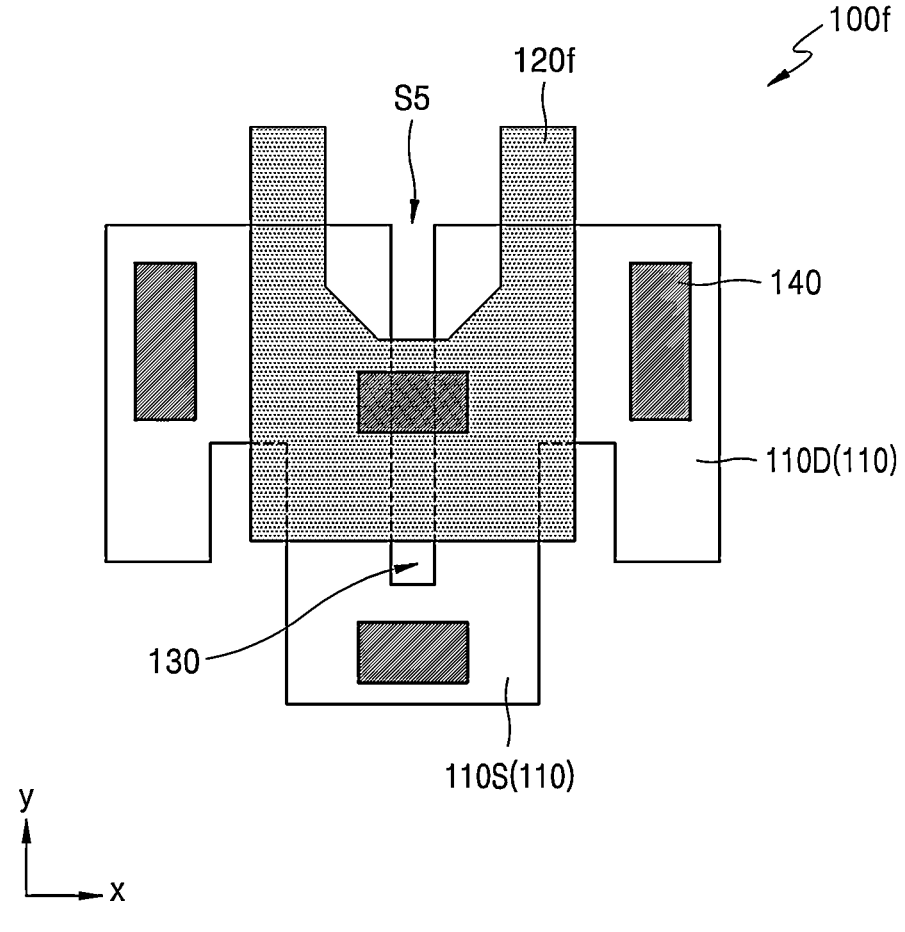

Referring to FIG. 7F, a transistor unit 100f of the present embodiment may be different from the transistor unit 100 of FIG. 2 in the shape of a gate 120f. In the transistor unit 100 of FIG. 2, the space between the two cars 120E of the gate 120 has the rectangular first shape S1. However, in the transistor unit 100f of the present embodiment, a structure between the two cars 120E of the gate 120f may have a fifth shape S5 including a partial shape of a polygon, for example, an octagonal shape, downward in the second direction (y-direction) and straight line shapes parallel to each other upward in the second direction (y-direction). In this manner, as can be seen in FIGS. 7E and 7F, portions of the two cars 120E furthest, in the second direction (y-direction), from the protrusion 110P of the active area 110 are straight lines parallel to each other, and portions of the two cars 120E closest, in the second direction (y-direction), to the protrusion 110P of the active area 110 have edges that form either part of a circle or a portion of a polygonal shape. Also, as can be seen in the various examples above, a gate arranged above the active area may cover a channel area of the active area, and may have a structure such as an inverted pi ($\Pi$) structure that from a plan view surrounds on three sides but does not cover a portion of the active area that includes two corner portions of the active area.

Figure 8A:
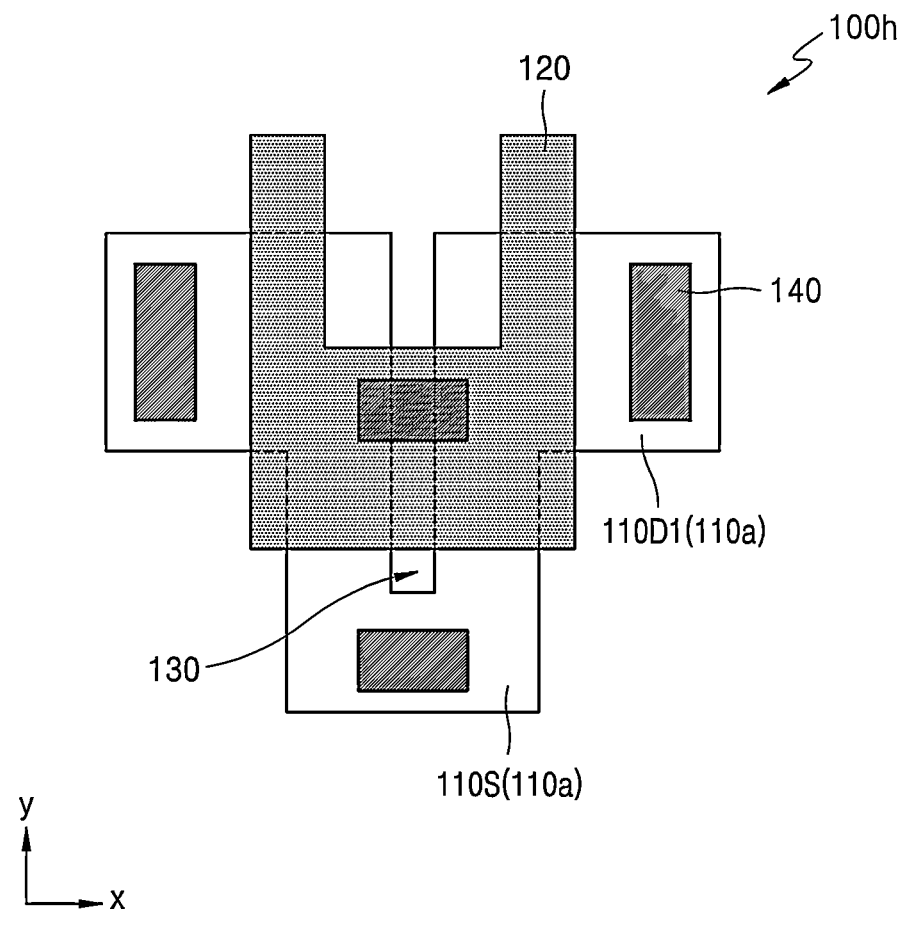
FIGS. 8A and 8B are plan views of a portion of a transistor unit according to embodiments.
Figure 8B:
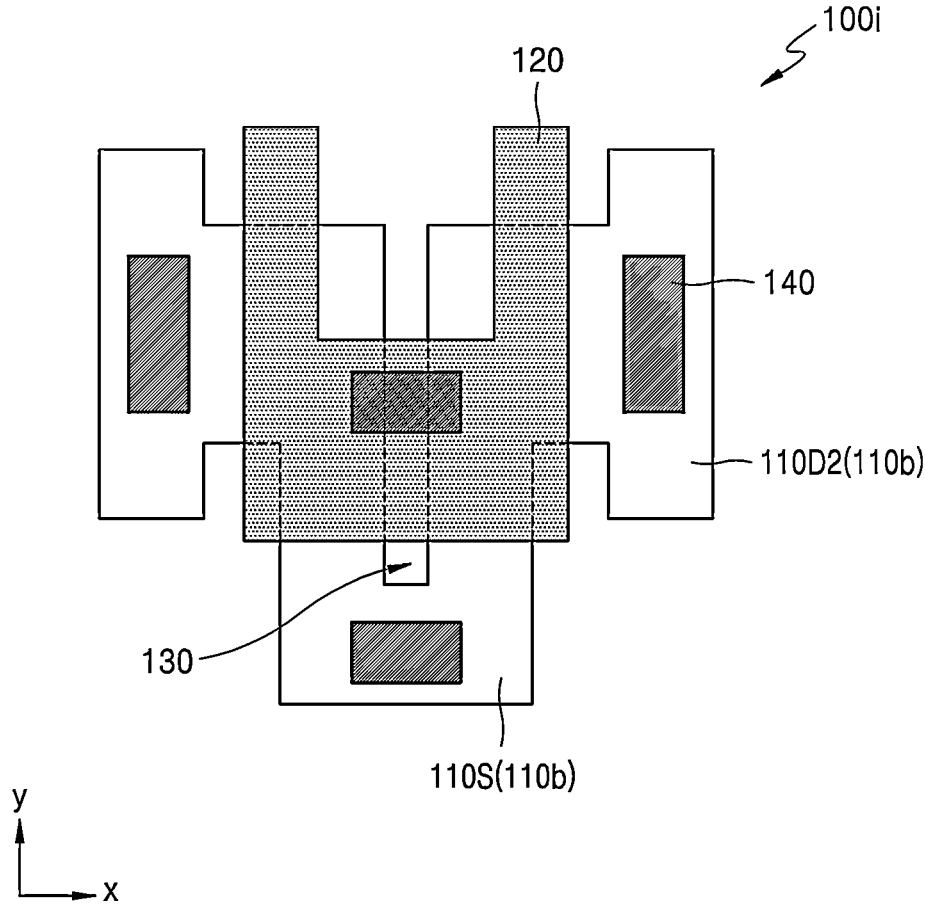

FIGS. 8A and 8B are plan views of a portion of a transistor unit according to embodiments. Contents already described in the description of FIGS. 1A to 3C and 7A to 7F will be simply described or omitted.

Referring to FIG. 8A, the gate 120, though shown to have the shape described in connection with FIG. 2, may alternately have the shame of any of the gates described in connection with FIGS. 7A-7F. Further referring to FIG. 8A, a transistor unit 100h of the present embodiment may be different from the transistor unit 100 of FIG. 2 in a structure of an active area 110a, particularly the drain area 110D1. In more detail, in the transistor unit 100h of the present embodiment, an extension may not be formed in the body 110B (of FIG. 3) of the active area 110a. Therefore, the body 110B of the active area 110a may include only a portion of the central body 110B1 (of FIG. 3) extending in the first direction (x-direction) without an extension.

Referring to FIG. 8B, a transistor unit 100i of the present embodiment may be different from the transistor unit 100 of FIG. 2 in a structure of an active area 110b, particularly the drain area 110D2. In more detail, in the transistor unit 100i of the present embodiment, the body 110B of the active area 110b may include the extension 110B2 formed to be symmetrical in the second direction (y-direction). For example, the body 110B of the active area 110b may include the central body 110B1 and the extension 110B2 extending upward and downward in the second direction (y-direction) at both ends of the central body 110B1 in the first direction (x-direction).

Figure 9A:
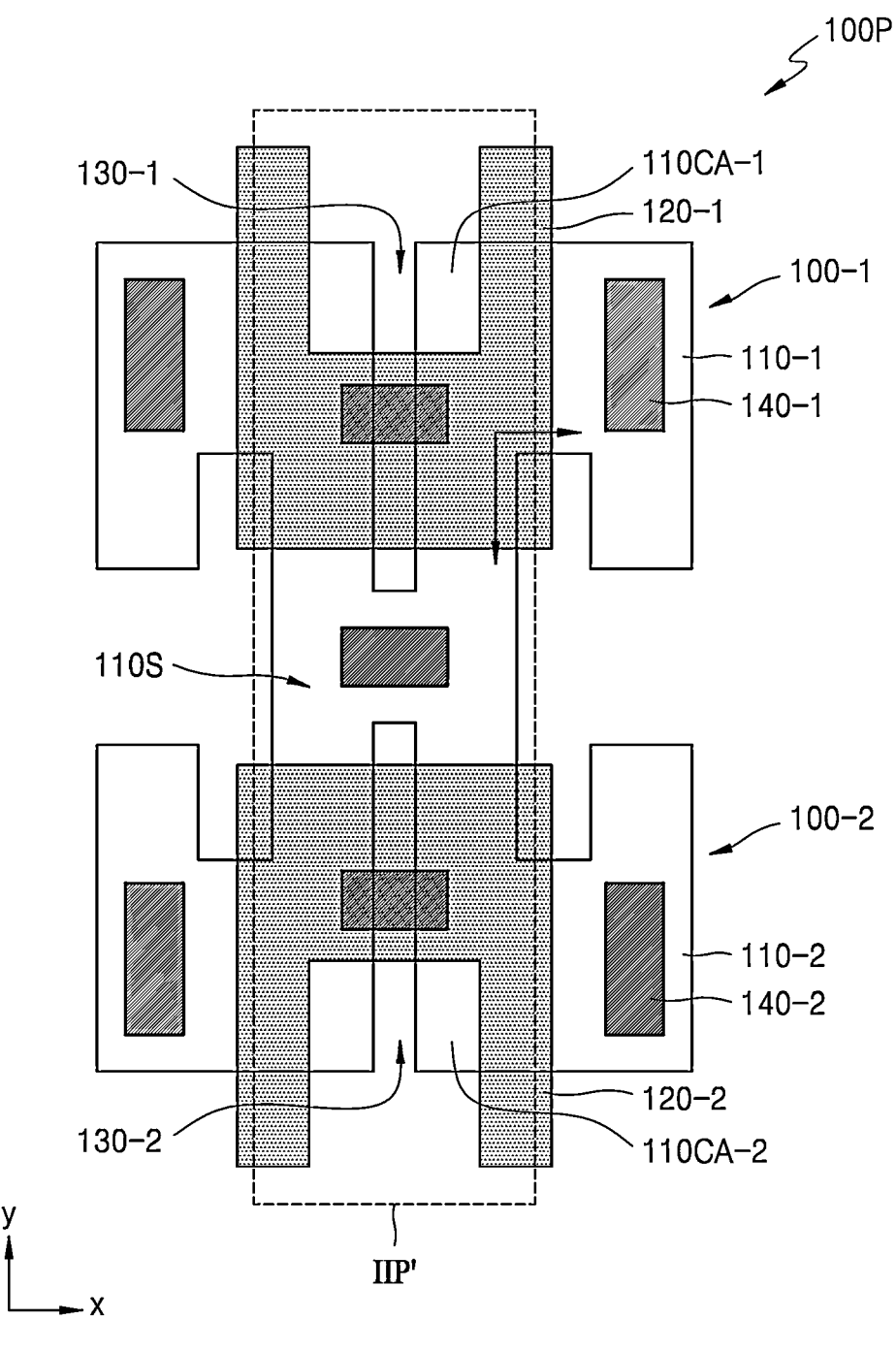
FIGS. 9A and 9B are a plan view and an SEM photograph, respectively, of a pair of transistor units in which two transistor units according to an embodiment are arranged to share a common source area.
Figure 9B:
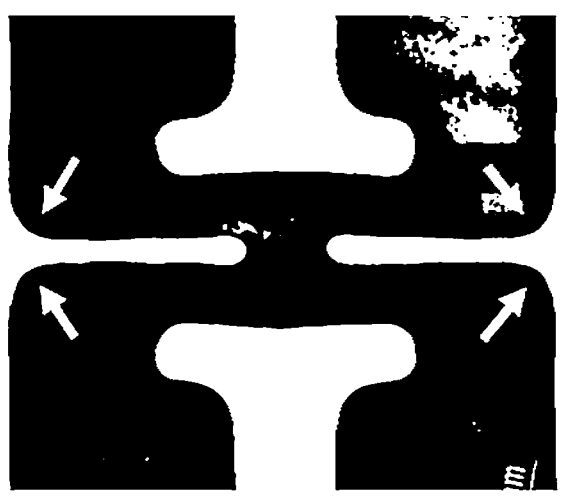

FIGS. 9A and 9B are a plan view and an SEM photograph, respectively, of a pair of transistor units in which two transistor units according to an embodiment are arranged to share a common source area. Contents already described in the description of FIGS. 1A to 3C and 7A to 8B will be simply described or omitted.

Referring to FIGS. 9A and 9B, a transistor unit pair 100P according to the present embodiment may include a first transistor unit 100-1 and a second transistor unit 100-2. Each of the first transistor unit 100-1 and the second transistor unit 100-2 may correspond to the transistor unit 100 of FIG. 2. In addition, each of the first transistor unit 100-1 and the second transistor unit 100-2 may have a structure of any one of the transistor units 100a to 100i of FIGS. 7A to 8B instead of the transistor unit 100 of FIG. 2.

As shown in FIG. 9A, the first transistor unit 100-1 and the second transistor unit 100-2 may share the common source area 110S. Accordingly, the common source area 110S may be shared by the two transistors KT1 and KT2 (of FIG. 1B) of the first transistor unit 100-1, and may also be shared by two transistors of the second transistor unit 100-2. On the other hand, in terms of the concept of a sub-word line driver, the first transistor unit 100-1 may correspond to a shared structure of the first transistor KT1 of the first sub-word line driver 200-1 and the second transistor KT2 of the second sub-word line driver 200-2, and the second transistor unit 100-2 may correspond to a shared structure of a third transistor of a third sub-word line driver (see 200-3 in FIG. 11B) and a fourth transistor of a fourth sub-word line driver (see 200-4 in FIG. 11B).

In the transistor unit pair 100P of the present embodiment, the common source area 110S and drain areas 110D of the first transistor unit 100-1 and the second transistor unit 100-2 may be formed through an ion implant process using an implant mask IIP' indicated by dashed lines. The common source area 110S and the drain areas 110D may be formed through separate implant processes. For example, the drain area 110D of the first transistor unit 100-1 and the second transistor unit 100-2 may be formed through an ion implant process using a first type of implant mask IIP' covering the common source area 110S, and the common source area 110S of the first transistor unit 100-1 and the second transistor unit 100-2 may be formed through an ion implant process using a second type of implant mask IIP that opens the common source area 110S opposite to the first type. Meanwhile, when the common source area 110S is formed, impurity ions may also be doped in the channel-avoidance area 110CA (in FIG. 2) of the first transistor unit 100-1 and the second transistor unit 100-2.

As can be seen through the arrows in an SEM photograph of FIG. 9B, in the transistor unit pair 100P of the present embodiment, a first gate 120-1 of the first transistor unit 100-1 and a second gate 120-2 of the second transistor unit 100-2 may expose channel-avoidance areas 110CA-1 and 110CA-2 of corresponding active areas 110-1 and 110-2 without covering the same. Therefore, a problem in which a gate oxide layer bursts due to a field, such as an E-field, concentrated in an edge portion adjacent to separation areas 130-1 and 130-2 may be effectively prevented.

Figure 10A:
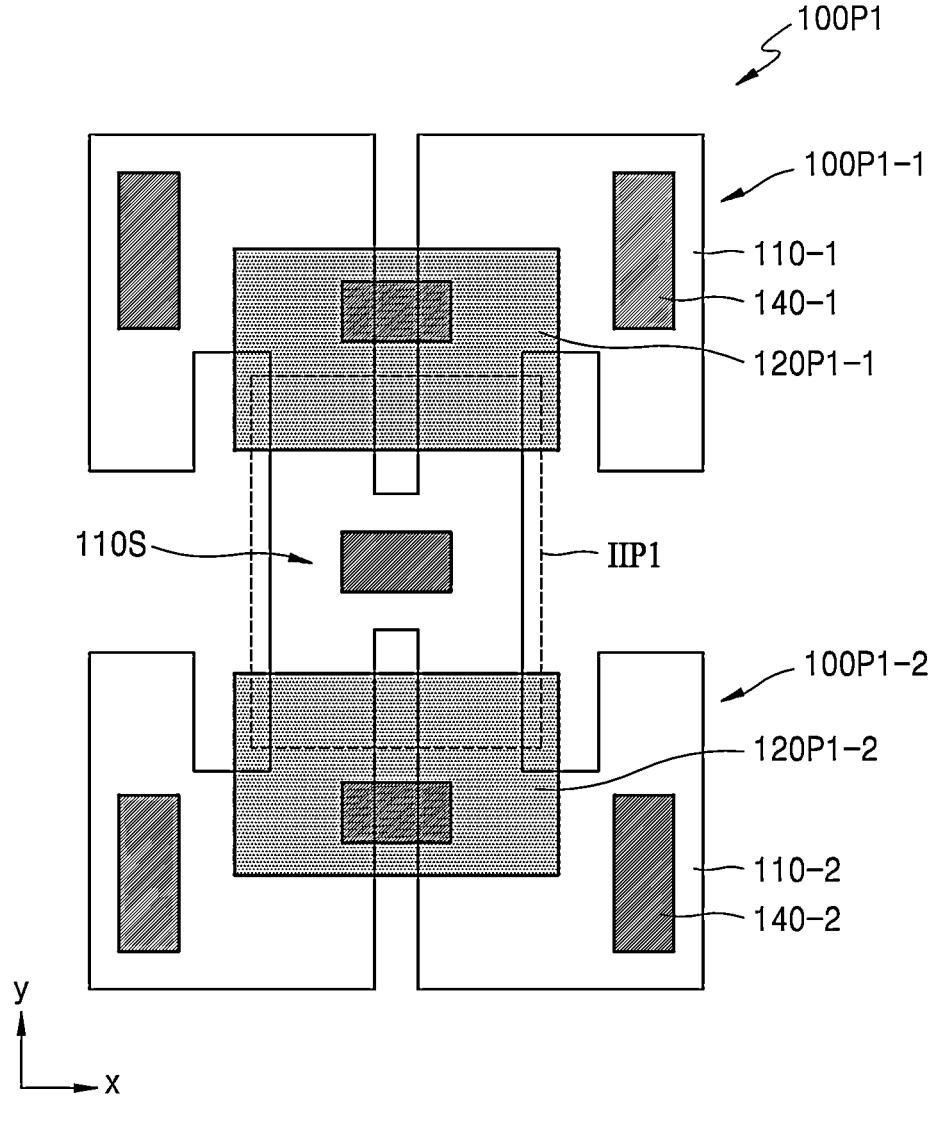
FIGS. 10A to 10C are plan views of a pair of transistor units of a comparative example for explaining an advantage of the pair of transistor units of FIG. 9A.
Figure 10B:
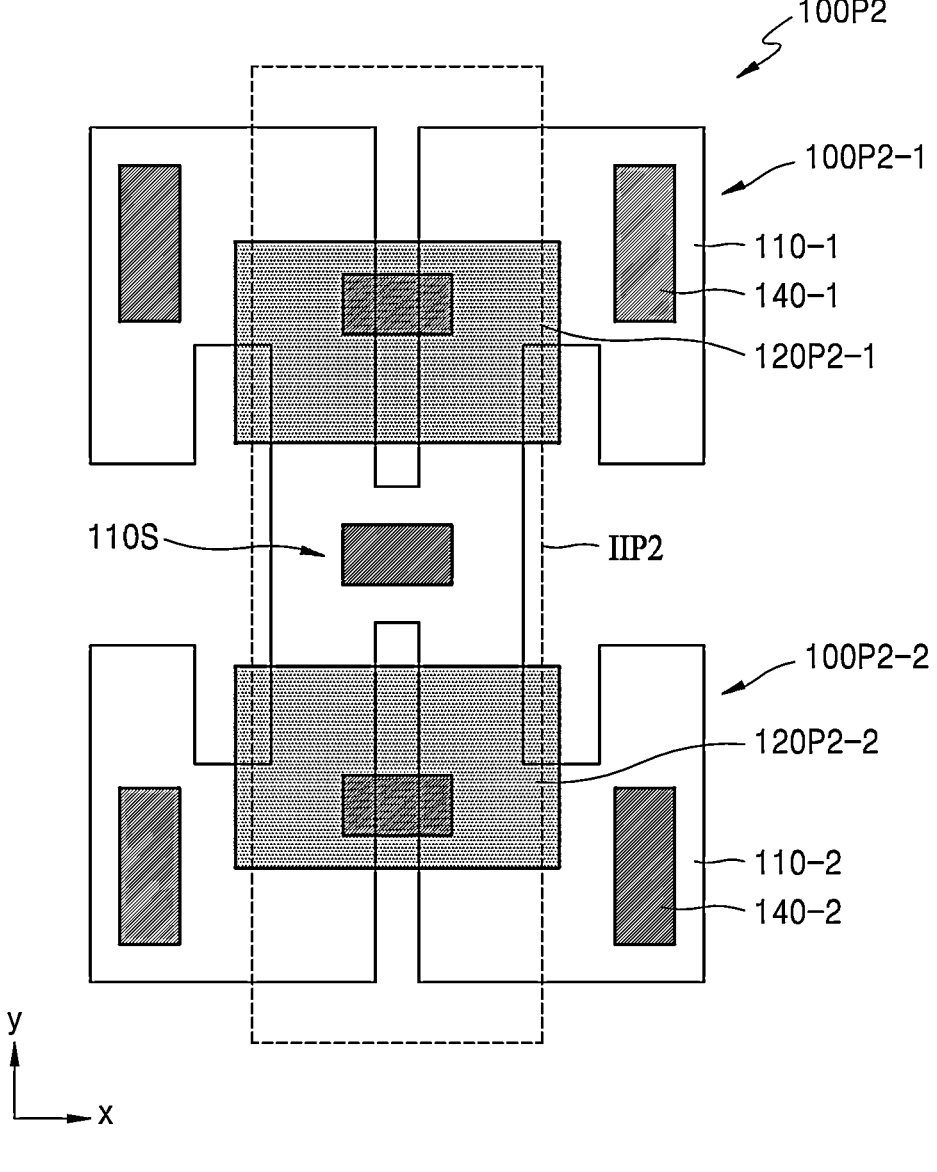
Figure 10C:
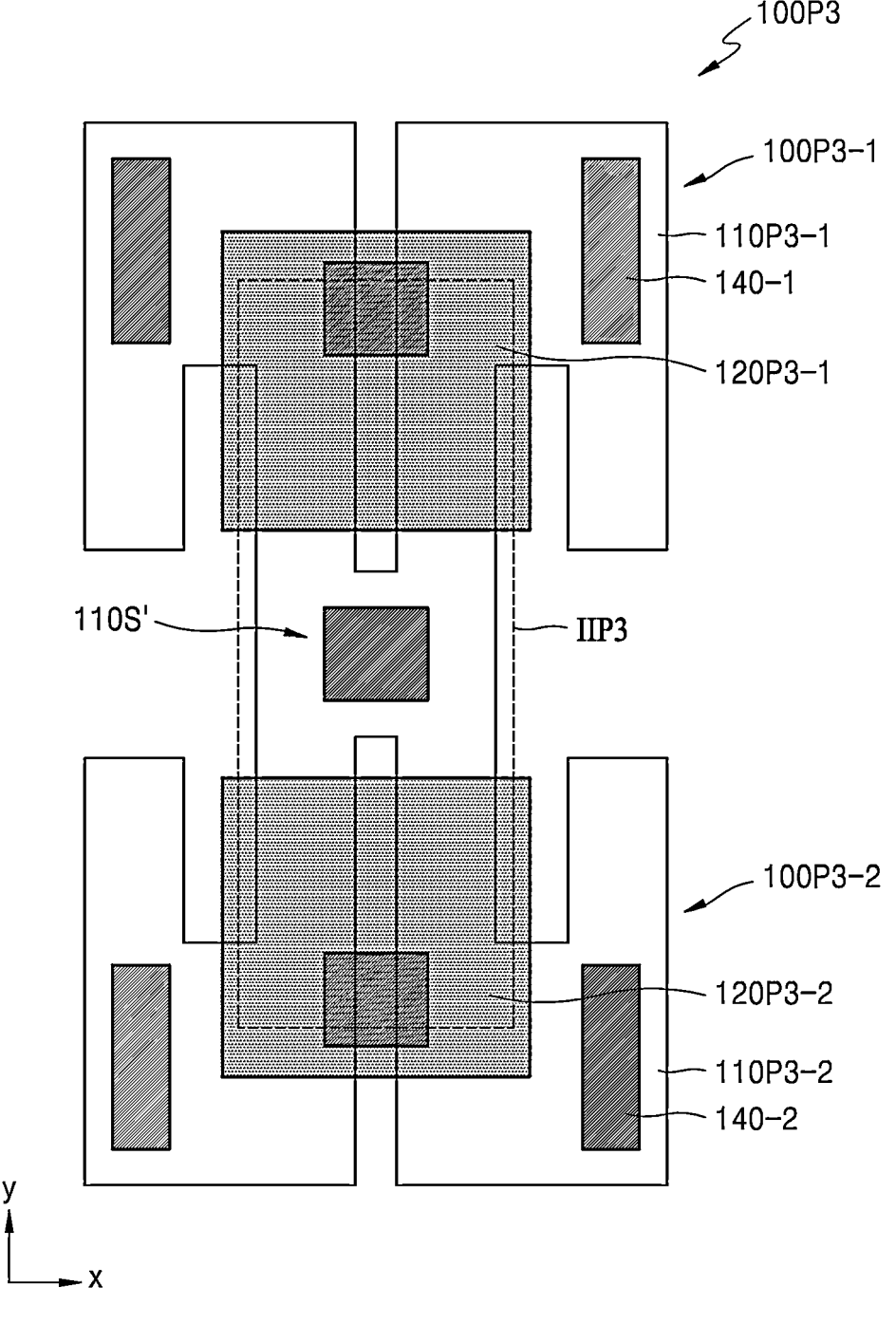

FIGS. 10A to 10C are plan views of a pair of transistor units of a comparative example for explaining an advantage of the pair of transistor units of FIG. 9A, wherein FIG. 10A shows a pair of transistor units of a first comparative example, FIG. 10B shows a pair of transistor units of a second comparative example, and FIG. 10C shows a pair of transistor units of a third comparative example.

Referring to FIG. 10A, in a transistor unit pair 100P1 according to the first comparative example, a first gate 120P1-1 of a first transistor unit 100P1-1 and a second gate 120P1-2 of a second transistor unit 100P1-2 may have only the head 120H (in FIG. 3C) and no cars. As such, when the gates 120P1-1 and 120P1-2 have a shape including only the head, in an ion implant process for the common source area 110S and the drain areas 110D, a process margin may not be sufficient because a small size of a first implant mask IIP1 is used as indicated by dashed lines. Therefore, in the ion implant process for the common source area 110S and the drain areas 110D, there is a problem in that a defect rate is increased or the process precision needs to be increased in order to minimize the defect rate. Meanwhile, the first implant mask IIP1 may also have a first type covering a corresponding area and a second type opening a corresponding area.

Referring to FIG. 10B, in a transistor unit pair 100P2 according to the second comparative example, shapes of gates 120P2-1 and 120P2-2 of transistor units 100P2-1 and 100P2-2 may be substantially the same as shapes of the gates 120P1-1 and 120P1-2 of the transistor units 100P1-1 and 100P1-2, in the transistor unit pair 100P1 according to the first comparative example. However, a shape of a second implant mask IIP2 used in the ion implant process for the common source area 110S and the drain areas 110D may be different from a shape of the first implant mask IIP1. In more detail, the second implant mask IIP2 is not limited to the common source area 110S and the gates 120P2-1 and 120P2-2, but may extend to the outside of the active areas 110-1 and 110-2 in the second direction (y-direction).

In the ion implant process for the common source area 110S and the drain areas 110D, when the second implant mask IIP2 is used, the second implant mask IIP2 is relatively larger in size than the first implant mask IIP1, and thus, a problem of securing a process margin may be addressed to some extent. However, in the ion implantation process for the common source area, as impurity ions are also implanted in a channel-avoidance area, there may be a risk of source/drain non-separation. Accordingly, deterioration of hot-carrier characteristics may occur, resulting in a problem of shortening a lifespan.

Referring to FIG. 10C, a transistor unit pair 100P3 according to the third comparative example shows a form in which the problem of securing a process margin of the transistor unit pair 100P1 according to the first comparative example and the source/drain non-separation problem of the transistor unit pair 100P2 according to the second comparative example are addressed, while maintaining only a head portion of gates 120P3-1 and 120P3-2 of transistor units 100P3-1 and 100P3-2. As can be seen through FIG. 10C, to prevent doping of impurity ions in a channel-avoidance area while forming a third implant mask IIP3 about the size of the second implant mask IIP2 to secure a process margin, heights of a common source area 110S' of channel areas 110P3-1 and 110P3-2 and the gates 120P3-1 and 120P3-2 in the second direction (y-direction) need to be increased. Consequently, the transistor unit pair 100P3 according to the third comparative example increases the height in the second direction (y-direction) compared to the transistor unit pair 100P of the present embodiment of FIG. 9A and the transistor unit pairs 100P1 and 100P2 according to the second and third comparative examples. Accordingly, a problem of increasing a chip size may occur.

In contrast, in the transistor unit pair 100P of the present embodiment, the first and second gates 120-1 and 120-2 of the first and second transistor units 100-1 and 100-2 have a structure including the head 120H and two cars 120E, so that the size may be minimized while addressing the problems of securing margins and source/drain non-separation in the ion implant process. As a result, the transistor unit pair 100P of the present embodiment may contribute to improving the reliability of a semiconductor device including the transistor unit pair 100P and reducing a chip size.

FIGS. 11A and 11B are a plan view of a semiconductor device according to an embodiment and a block diagram illustrating a structure of a portion of the semiconductor device, respectively. FIGS. 11A and 11B will be described with reference to FIGS. 1A to 3C together, and contents already described in the description of FIGS. 1A to 10C will be simply described or omitted.

Referring to FIGS. 11A and 11B, a semiconductor device 1000 based on a transistor unit of the present embodiment (hereinafter simply referred to as 'semiconductor device') may include a cell area CA and a core/peri area CO/PA. The term "semiconductor device" may refer a semiconductor chip formed on a die from a waver, or may refer to a semiconductor package, including one or more semiconductor chips formed on a package substrate. One or more of various memory devices may be arranged in the cell area CA. For example, various memory devices such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), and resistive random access memory (RRAM) may be arranged in the cell area CA.

A peripheral circuit for operation of memory cells and/or a core circuit for operation may be arranged in the core/peri area CO/PA. For example, the entire areas other than the cell area CA may be referred to as the core/peri area CO/PA. However, according to an embodiment, the core/peri area CO/PA may be divided into a peripheral circuit area PA in which peripheral circuits are arranged and a core circuit area CO in which a core circuit is arranged. Also, in general, a peripheral circuit area may be arranged at the outer or central portion of a chip, and a core circuit area may be between the cell areas CA. Hereinafter, the peripheral circuit area and the core circuit area are not distinguished, and are collectively referred to as the core/peri area CO/PA.

In the semiconductor device 1000 of the present embodiment, a specific name of the semiconductor device 1000 may vary depending on what type of memory device is included in the cell area CA. For example, when flash memory devices are included in the cell area CA, the semiconductor device 1000 may correspond to a flash memory semiconductor device. In addition, when DRAM devices are included in the cell area CA, the semiconductor device 1000 may correspond to a DRAM semiconductor device. Hereinafter, for convenience of explanation, a DRAM semiconductor device will be mainly described. However, the semiconductor device 1000 of the present embodiment is not limited to the DRAM semiconductor device.

The DRAM semiconductor device corresponding to the semiconductor device 1000 of the present embodiment may include a row decoder 300, pre-decoders 310 and 320, driving voltage generators 400-1, 400-2, 400-3, and 400-4, sub-word line drivers 200-1, 200-2, 200-3, and 200-4, sense amplifier blocks 500, a cell array 600, and conjunctions 700. The cell array 600 may be previously arranged in the cell area CA, and the remaining row decoder 300, the pre-decoders 310 and 320, the driving voltage generators 400-1, 400-2, 400-3, and 400-4, the sub-word line drivers 200-1, 200-2, 200-3, and 200-4, the sense amplifier blocks 500, and the conjunctions 700 may be arranged in the core/peri area CO/PA. Because embodiments of the inventive concept relate to a sub-word line driver, the description of a column selection structure will be omitted.

The row decoder 300 may select a word line of a memory cell to be accessed in response to an input row address RADD. The row decoder 300 may generate word line enable signals NWEI<n> (n is an integer greater than or equal to 0) for enabling a corresponding word line by decoding the input row address RADD. The word line enable signals NWEI<n> of the row decoder 300 may be activated in a write operation mode or a read operation mode for selected memory cells. In addition, in a self-refresh operation mode, the row decoder 300 may enable a corresponding word line by decoding the row address RADD generated from an address counter (not shown).

The pre-decoders 310 and 320 may generate pre-decoding signals PXI<0>, PXI<1>, PXI<2>, PXI<3>, . . . in response to the row address RADD. For example, the pre-decoders 310 and 320 may generate pre-decoding signals PXI<j> (j is an integer greater than or equal to 0) corresponding to a selected word line by decoding lower bits of the row address RADD. The pre-decoding signals PXI<j> may be transmitted to the driving voltage generators 400-1, 400-2, 400-3, and 400-4 in the conjunctions 700 through a main word line.

The driving voltage generators 400-1, 400-2, 400-3, and 400-4 may generate driving signals PXID<i>/PXIB<i> for driving a word line in response to the pre-decoding signals PXI<0>, PXI<1>, PXI<2>, PXI<3>, . . . . As a semiconductor memory device becomes highly integrated and high-speed, the level of the high voltage VPP for driving a word line may greatly affect reliability of the semiconductor memory device. In order to increase the reliability of the semiconductor memory device, it is important to reduce the level of the high voltage VPP and prevent a high voltage level from being lowered due to a leakage current or the like. Therefore, the driving voltage generators 400-1, 400-2, 400-3, and 400-4 may include a pull-up driver to supply the high voltage VPP to a selected word line. In general, a pull-up driver may include a PMOS transistor.

The sub-word line drivers 200-1, 200-2, 200-3, and 200-4 may activate or precharge the selected word line in response to the word line enable signals NWEI<n> and the driving signals PXID<i>/PXIB<i>. When a memory cell MC1 is selected, a word line enable signal NWEI<0> is activated, and the driving signals PXID<2> and PXIB<2> provided from the driving voltage generator 400-1 may be activated. Accordingly, the first sub-word line driver 200-1 may drive the word line WL<1> with the high voltage VPP, which is the level of the driving signal PXID<2>. The operation of the first sub-word line driver 200-1 is equally applied to the remaining sub-word line drivers 200-2, 200-3, 200-4, 200'-1, 200'-2, 200'-3, and 200'-4.

Each of the sub-word line drivers 200-1, 200-2, 200-3, 200-4, 200'-1, 200'-2, 200'-3, and 200'-4 of the disclosure may include a keeping transistor composed of NMOS transistors. The keeping transistor may correspond to the first and second transistors KT1 and KT2 in the sub-word line drivers 200-1 and 200-2 of FIGS. 1A and 1B above. Through such a keeping transistor, the sub-word line drivers 200-1, 200-2, 200-3, 200-4, 200'-1, 200'-2, 200'-3, and 200'-4 may precharge a deactivated word line with the negative voltage VBB2. For example, the first sub-word line driver 200-1 may include a keeping transistor for precharging the word line WL<1> with the negative voltage VBB2 in response to the driving signal PXIB<2>. Likewise, the adjacent second sub-word line driver 200-2 may also include a keeping transistor for precharging the word line WL<5> with the negative voltage VBB2 in response to the driving signal PXIB<2>.

In the semiconductor device 1000 according to the present embodiment, the two keeping transistors KT1 and KT2 of the adjacent sub-word line drivers 200-1 and 200-2 may constitute the transistor unit 100 as described in the description of FIGS. 1A and 1B. Therefore, the two keeping transistors KT1 and KT2 may share the gate 120, and may include one common source area 110S to which the negative voltage VBB2 is provided. In more detail, each of the two keeping transistors KT1 and KT2 constituting the transistor unit 100 may include the active area 110 having a "T" shape including the separated drain areas 110D connected to word lines and the common source area 110S for supplying the negative voltage VBB2. In addition, the two keeping transistors KT1 and KT2 may share the gate 120, and the gate 120 may have an inverted pi ( $\Pi$ ) shape and/or one of the shapes described above in connection with FIGS. 2, 7A-7F, 8A, and 8B. Due to the structure of the active area 110 and the gate 120, each of the two keeping transistors KT1 and KT2 may have a "T"-shaped channel. As a result, each of the two keeping transistors KT1 and KT2 may maintain a relatively long channel, and thus, even if the high voltage VPP is applied to the gate 120 of the keeping transistors KT1 and KT2, the keeping transistors KT1 and KT2 may have heat resistance due to the length of the long channel. Meanwhile, the shape of the gate 120 and the shape of the channel of the keeping transistors KT1 and KT2 of the sub-word line drivers 200-1 and 200-2 may be equally applied to the adjacent sub-word line drivers 200-3 and 200-4, and the sub-word line drivers 200'-1, 200'-2, 200'-3, and 200'-4 above the cell array 600, respectively.

A sense amplifier block 500 may access a memory cell using a bit line pair BL/BLB of a selected column in response to a column address. In addition, the sense amplifier block 500 may further include components for storing input data in a selected memory cell. The sense amplifier block 500 may rewrite data stored in the memory cell in a self-refresh mode. The sense amplifier block 500 may be connected to memory cells in an open bit line structure.

In the cell array 600, a plurality of memory cells MCs may be connected to word lines WL and bit lines BL, respectively, and may be arranged in a row direction and a column direction. Each of the memory cells MCs may include a cell capacitor and an access transistor. A gate of the access transistor may be connected to any one of the word lines WL arranged in the row direction. One end of the access transistor may be connected to a bit line BL or a complementary bit line BLB arranged in the column direction. The other end of the access transistor may be connected to a cell capacitor.

In a DRAM semiconductor device that is the semiconductor device 1000 according to an embodiment, sub-word line drivers SWD may include the transistor unit 100 having a shared gate structure. Therefore, the semiconductor device 1000 according to an embodiment may implement a semiconductor device with improved reliability and a reduced chip size due to the advantages of the transistor unit 100 described above.

As described above, and as can be seen from the various above-described embodiments, a semiconductor device may include a shared gate structure. The semiconductor device may include an active area having a first portion extending in a first direction (e.g., x-direction) parallel to a top surface of a substrate, and a protrusion protruding from the first portion and extending in a second direction (e.g., y-direction) perpendicular to the first direction and parallel to the top surface of the substrate. A separation area (e.g., 130) may extend in the second direction from a first end to a second end and may divide the active area into a first active portion on a first side of the separation area and a second active portion on a second, opposite side of the separation area. The separation area may also divide a first portion of the protrusion into a first protrusion part on the first side of the separation area and a second protrusion part on the second side of the separation area. The first end of the separation area may be on the active area and the second end of the separation area may be on the first portion of the protrusion. Two 3D corner portions of the active area may be adjacent to the first end of the separation area, and a gate may be arranged above the active area to cover a channel area of the active area while exposing the two 3D corner portions. In various embodiments, the separation area extends in the second direction beyond a first edge of the gate, and also extends beyond a second edge of the gate opposite the first edge in the second direction. Also, part of the gate extends beyond the separation area and beyond the active area in the second direction, and the two 3D corner portions may be between a first portion of the gate and a second portion of the gate in the first direction.

The first portion of the gate may be a first car, and the second portion of the gate may be a second car, and the first car and second car may be connected to each other by a third portion of the gate which a head. The head may cover a portion of the body of the active area and a portion of the protrusion of the active area, and the first and second ears may cover a portion of the body of the active area and extend from the body of the active area beyond an edge of the active area. The active area and the gate may be part of a transistor structure, and a space between the two cars may have a form of a rectangle, a triangle, a semicircle, or a half ellipse, among other shapes. The active area may form a T-shape; and the gate may form an inverted pi ( ) shape with respect the T-shape being oriented in a right-side up manner. The active area and gate may be part of a transistor structure that includes a first transistor and second transistor that share the gate, wherein the first transistor is part of a first sub-word line driver, and the second transistor is part of a second sub-word line driver.

While the inventive concept has been particularly shown and described with reference to embodiments thereof, it will be understood that various changes in form and details may be made therein without departing from the spirit and scope of the following claims.

What is claimed is:

1. A sub-word line driver comprising:
a first sub-word line driver having a first transistor for supplying a negative voltage to a first word line in response to a driving signal; and
a second sub-word line driver having a second transistor for supplying the negative voltage to a second word line in response to the driving signal,
wherein:
the first transistor and the second transistor constitute a transistor unit,
the transistor unit includes a gate having, when viewed in a plan view, an inverted pi ( ) shape having a concave portion formed by two connected legs with a space therebetween, and
the first and second transistors share the gate.

2. The sub-word line driver of claim 1, wherein the transistor unit further comprises:

an active area having a body extending in a first direction on a substrate, and a protrusion extending in a second direction perpendicular to the first direction from a central portion of the body; and
a separation area extending from a first end to a second end in the second direction to separate the body and a first portion of the protrusion, respectively,
wherein:
the gate is arranged above the active area to cover a channel area of the active area and to not cover a portion of the active area, the uncovered portion being a channel-avoidance area of the body, which is adjacent to the first end of the separation area,
the active area is divided into a first active area and a second active area by the separation area, wherein the first active area is connected to the second active area through a second portion of the protrusion, and
opposite ends of the body in the first direction correspond to two drain areas, the second portion corresponds to a common source area, and the opposite ends, the second portion, and the gate constitute the first and second transistors.

3. The sub-word line driver of claim 2, wherein the active area has a T-shape.

4. The sub-word line driver of claim 2, wherein:
the gate includes a head covering the body and the first portion, and two ears covering the body and being apart from each other in the first direction while extending away from the head in the second direction,
the channel-avoidance area is exposed between the two ears, with respect to the gate, and
each of the ears extends outside of the active area in the second direction.

5. The sub-word line driver of claim 4, wherein, from a plan view, each of the ears extends outside of the active area in the second direction.

6. The sub-word line driver of claim 4, wherein each of the ears has an elongated shape in the second direction, and wherein each of the ears includes a tab at an end portion in the second direction, or for each ear, a width in the second direction of the end portion is greater than a width in the second direction of other portions of the ear.

7. The sub-word line driver of claim 4, wherein from a plan view, the second end of the separation area protrudes from one side of the head and is exposed with respect to the gate.

8. The sub-word line driver of claim 4, wherein each of the ears has a shape that enhances separation of a source area and a drain area in an ion implant process.

9. The sub-word line driver of claim 2, wherein a corner-shaped channel is formed between the common source area and the two drain areas.

10. The sub-word line driver of claim 2, wherein the common source area is shared by other transistor units.

11. A sub-word line driver, comprising:
a first sub-word line driver having a first transistor for supplying a negative voltage to a first word line in response to a driving signal; and
a second sub-word line driver having a second transistor for supplying the negative voltage to a second word line in response to the driving signal,
wherein the first transistor and the second transistor constitute a transistor circuit with a shared gate structure, and
wherein the transistor circuit comprises:

an active area having a body extending in a first direction on a substrate, and a protrusion extending in a second direction perpendicular to the first direction from a central portion of the body in the first direction; and a gate arranged above the active area to overlap a channel area of the active area, and having an inverted pi ( $\Pi$ ) structure that, from a plan view, surrounds on three sides but does not cover a portion of the active area that includes two corner portions of the active area.

12. The sub-word line driver of claim 11, wherein:

the active area is divided into a first active area and a second active area by a separation area extending in the second direction and separating the body and a portion of the protrusion, the protrusion is divided into a first portion separated into two sub-portions by the separation area and a second portion, wherein the first portion is between the body and the second portion in the second direction, and opposite ends of the body in the first direction correspond to two drain areas, the second portion of the protrusion corresponds to a common source area, and the gate constitutes two transistors, wherein the two transistors share the gate.

13. The sub-word line driver of claim 12, wherein:

the inverted pi ( $\Pi$ ) structure includes a head covering the body of the active area and the first portion of the protrusion of the active area, and two ears covering the body of the active area and being apart from each other in the first direction while extending away from the head in the second direction, and a channel-avoidance area is exposed with respect to the gate between the two ears.

14. The sub-word line driver of claim 13, wherein:

each of the ears extends outside of the active area in the second direction, and in the plan view, a second end of the separation area opposite a first end in the second direction protrudes from the head in the second direction and is exposed with respect to the gate.

15. A semiconductor device comprising:

a cell area in which a plurality of memory cells are arranged in a two-dimensional array structure; and a core/peri area around the cell area and including driving circuits for driving the plurality of memory cells, wherein a sub-word line driver, which is one of the driving circuits, is in the core/peri area and comprises:

a first sub-word line driver having a first transistor for supplying a negative voltage to a first word line in response to a driving signal; and a second sub-word line driver having a second transistor for supplying the negative voltage to a second word line in response to the driving signal, wherein the first transistor and the second transistor constitute a transistor unit, wherein the transistor unit includes a gate having, when viewed in a plan view, an inverted pi ( $\Pi$ ) shape having two sides having a space therebetween and extending from a third side connecting the two sides, and wherein the first and second transistors share the gate.

16. The semiconductor device of claim 15, wherein the transistor unit further comprises:

an active area having a body extending in a first direction on a substrate, and a protrusion extending in a second direction perpendicular to the first direction from a central portion of the body; and a separation area extending from a first end to a second end in the second direction to separate the body and a first portion of the protrusion, respectively, wherein the gate is arranged above the active area to cover a channel area of the active area and to not cover a portion of the active area, the uncovered portion being a channel-avoidance area of the body, which is adjacent to the first end of the separation area, wherein the active area is divided into a first active area and a second active area by the separation area, wherein the first active area is connected to the second active area through a second portion of the protrusion, and wherein opposite ends of the body in the first direction correspond to two drain areas, the second portion corresponds to a common source area, and the opposite ends, the second portion, and the gate constitute the first and second transistors.

17. The semiconductor device of claim 16, wherein:

the gate includes a head covering the body and the first portion, and two ears covering the body and being apart from each other in the first direction while extending away from the head in the second direction, the channel-avoidance area is exposed between the two ears with respect to the gate, and each of the ears extends outside of the active area in the second direction.

18. The semiconductor device of claim 17, wherein the second end of the separation area protrudes in the second direction from a lower surface of the head and is exposed with respect to the gate.

19. The semiconductor device of claim 16, wherein the common source area is shared by other transistor units.

20. The semiconductor device of claim 15, wherein DRAM cells are arranged in the cell area.

* * * * *